(12) United States Patent
Ito et al.

(10) Patent No.: US 7,898,173 B2
(45) Date of Patent: Mar. 1, 2011

(54) PATTERN FORMED OBJECT FOR AN ELECTROLUMINESCENT DISPLAY

(75) Inventors: Nobuyuki Ito, Tokyo-To (JP); Norihito Ito, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 319 days.

(21) Appl. No.: 11/980,273

(22) Filed: Oct. 30, 2007

(65) Prior Publication Data

US 2008/0067931 A1 Mar. 20, 2008

Related U.S. Application Data

(62) Division of application No. 10/630,089, filed on Jul. 30, 2003, now Pat. No. 7,307,381.

(30) Foreign Application Priority Data

Jul. 31, 2002 (JP) .............................. 2002-222296
Aug. 8, 2002 (JP) .............................. 2002-230899

(51) Int. Cl.
*H05B 33/00* (2006.01)
*H05B 33/02* (2006.01)

(52) U.S. Cl. ........................ 313/506; 313/504; 445/24; 428/690; 428/917

(58) Field of Classification Search .......... 313/504–506
See application file for complete search history.

(56) References Cited

U.S. PATENT DOCUMENTS

| 5,742,129 | A | 4/1998 | Nagayama et al. |
| 5,834,893 | A | 11/1998 | Bulovic et al. |
| 6,339,288 | B1* | 1/2002 | Qian et al. .................. 313/498 |
| 6,380,672 | B1* | 4/2002 | Yudasaka ..................... 313/504 |
| 6,580,212 | B2 | 6/2003 | Friend |
| 6,891,327 | B2 | 5/2005 | Duineveld et al. |

(Continued)

FOREIGN PATENT DOCUMENTS

EP 0917410 A1 5/1999

(Continued)

OTHER PUBLICATIONS

Search report dated Mar. 22, 2004 for corresponding British Application No. GB 0317863.9.

(Continued)

*Primary Examiner*—Sikha Roy
(74) *Attorney, Agent, or Firm*—Harness, Dickey & Pierce, PLC

(57) ABSTRACT

A pattern formed object for an electroluminescent element includes a substrate; partition walls provided on the substrate; and a coating stacked on the substrate in its part between the partition walls. The partition walls have a sloped liquid-non-repellent surface and have such a sectional form that, at least in the lower part of the partition wall, as the distance from the substrate increases, the size of the partition wall in a direction parallel to the substrate decreases, and, in the coating, the ratio of the maximum thickness (Tmax) to the minimum thickness (Tmin), Tmax/Tmin, is not more than 130% as measured in the coating in its part between the lower ends of the partition walls adjacent to each other.

8 Claims, 17 Drawing Sheets

U.S. PATENT DOCUMENTS

| | | | |
|---|---|---|---|
| 7,102,280 B1* | 9/2006 | Duineveld et al. | 313/504 |
| 2002/0047514 A1* | 4/2002 | Sakurai et al. | 313/503 |
| 2002/0060518 A1 | 5/2002 | Duineveld et al. | |
| 2002/0074936 A1 | 6/2002 | Yamazaki et al. | |
| 2003/0098645 A1 | 5/2003 | Lee et al. | |
| 2003/0107314 A1 | 6/2003 | Urabe et al. | |
| 2003/0111957 A1 | 6/2003 | Kim et al. | |
| 2003/0142043 A1* | 7/2003 | Matsueda | 345/30 |

FOREIGN PATENT DOCUMENTS

| | | |
|---|---|---|
| EP | 1331667 A2 | 7/2003 |
| GB | 2373095 A | 9/2002 |
| KR | 2002090569 A | 12/2002 |

OTHER PUBLICATIONS

Search report dated Oct. 31, 2003 for corresponding British Application No. GB 0317863.9.

* cited by examiner

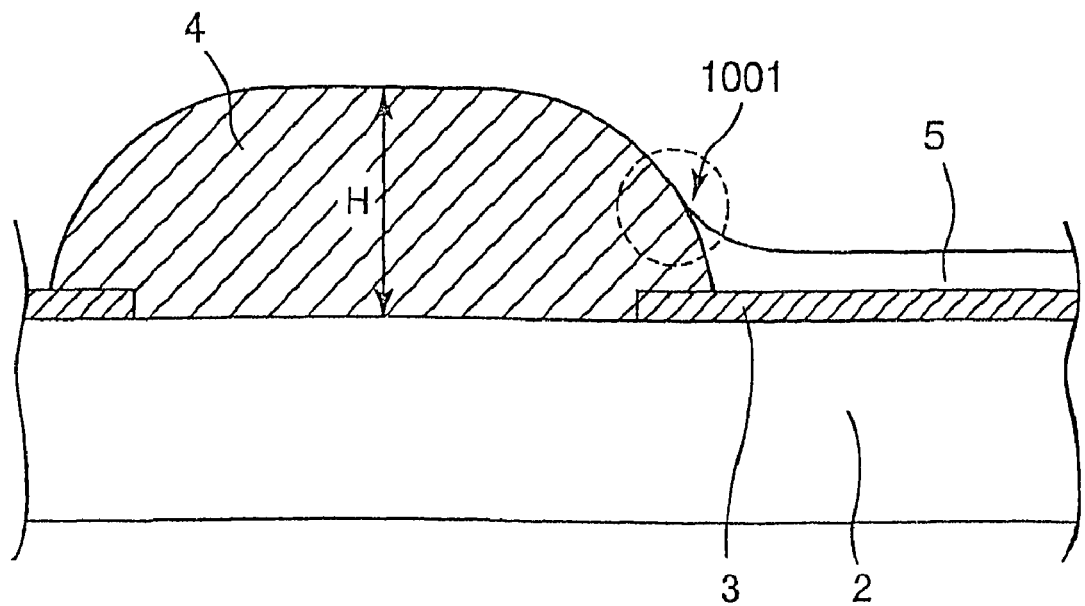
FIG. 3
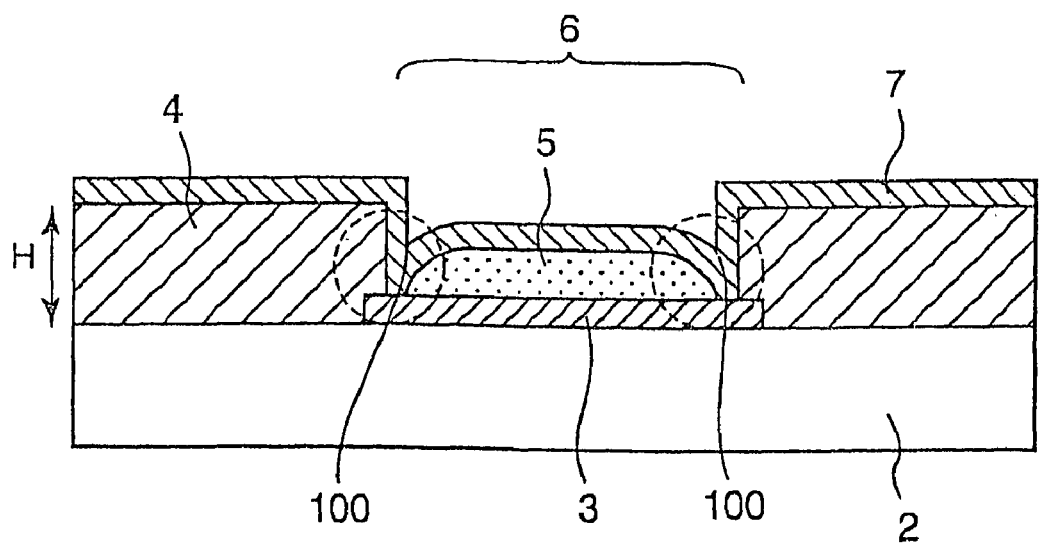
FIG. 4 - PRIOR ART

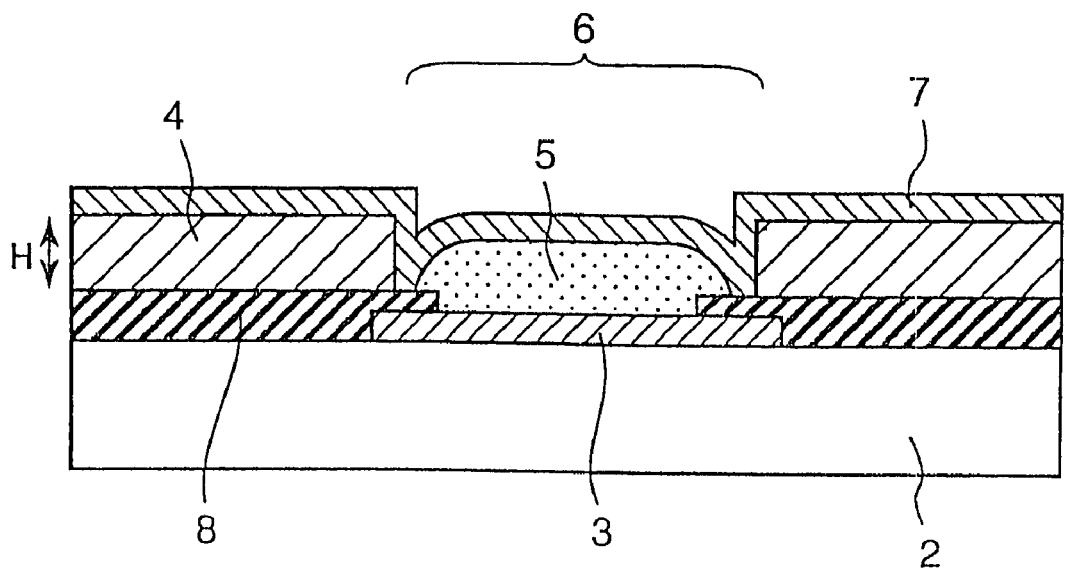
FIG. 5 - PRIOR ART
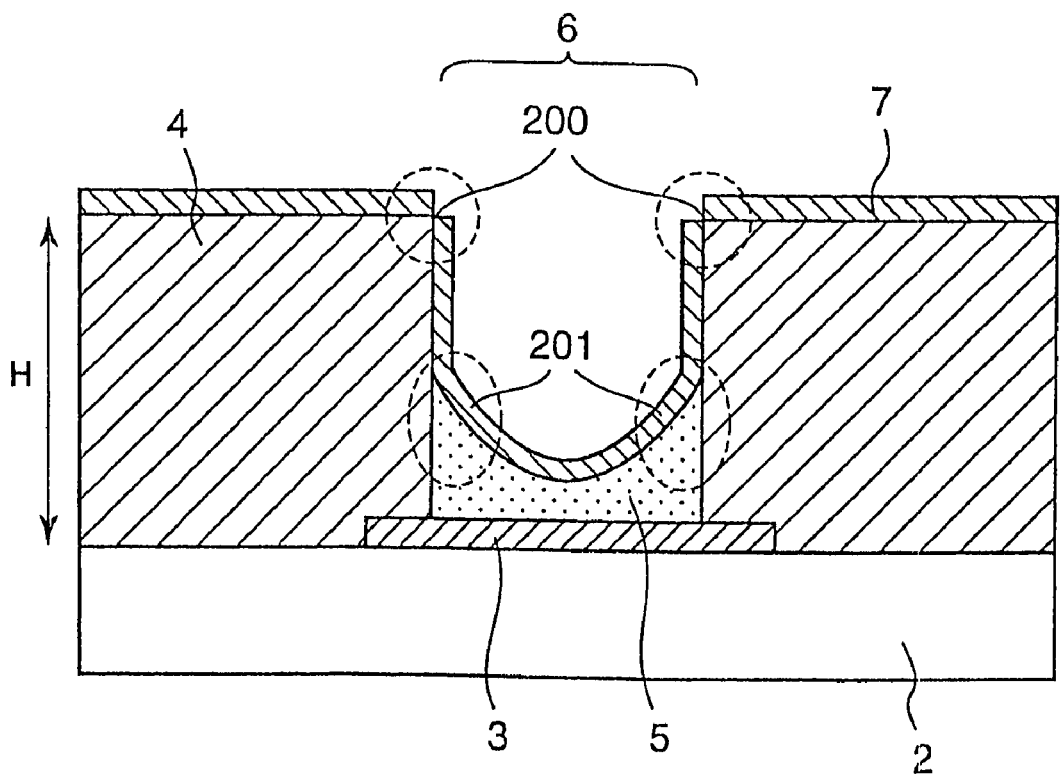
FIG. 6 - PRIOR ART

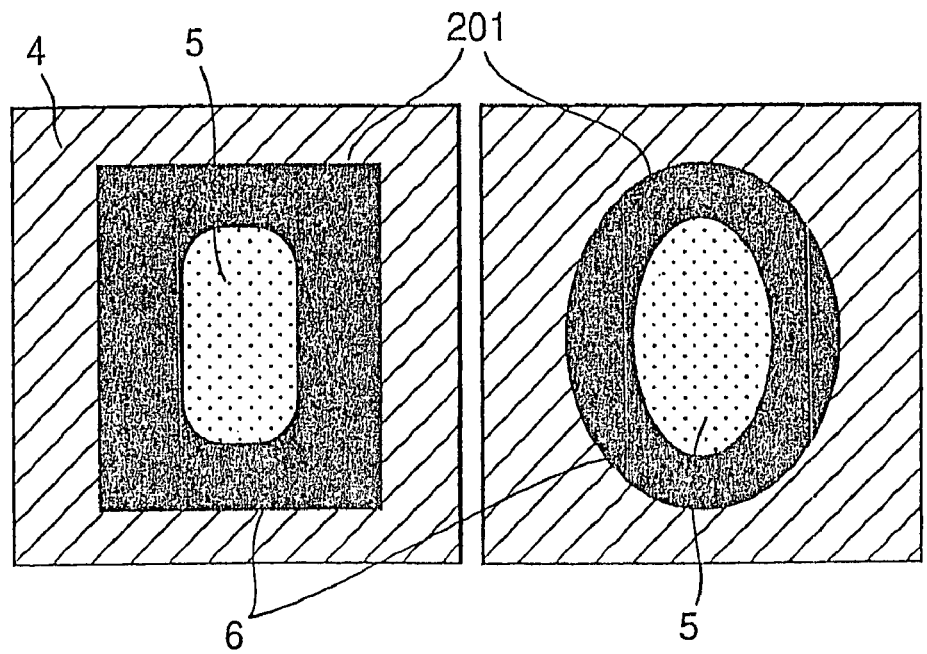
FIG. 7 - PRIOR ART
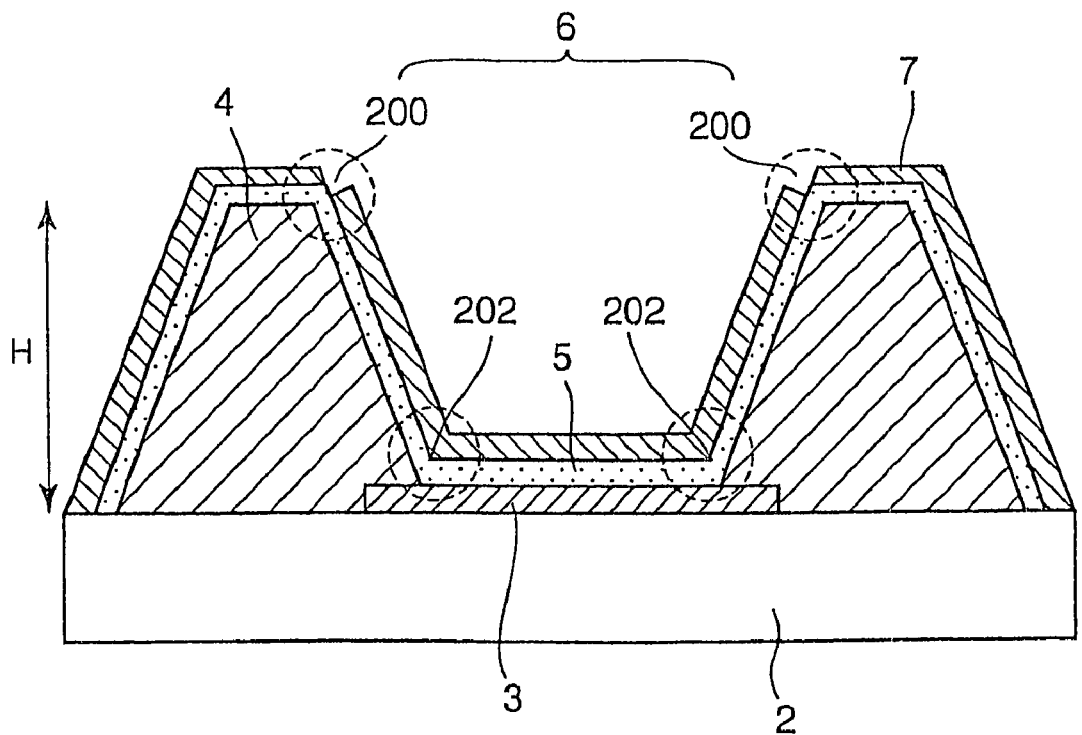
FIG. 8 - PRIOR ART

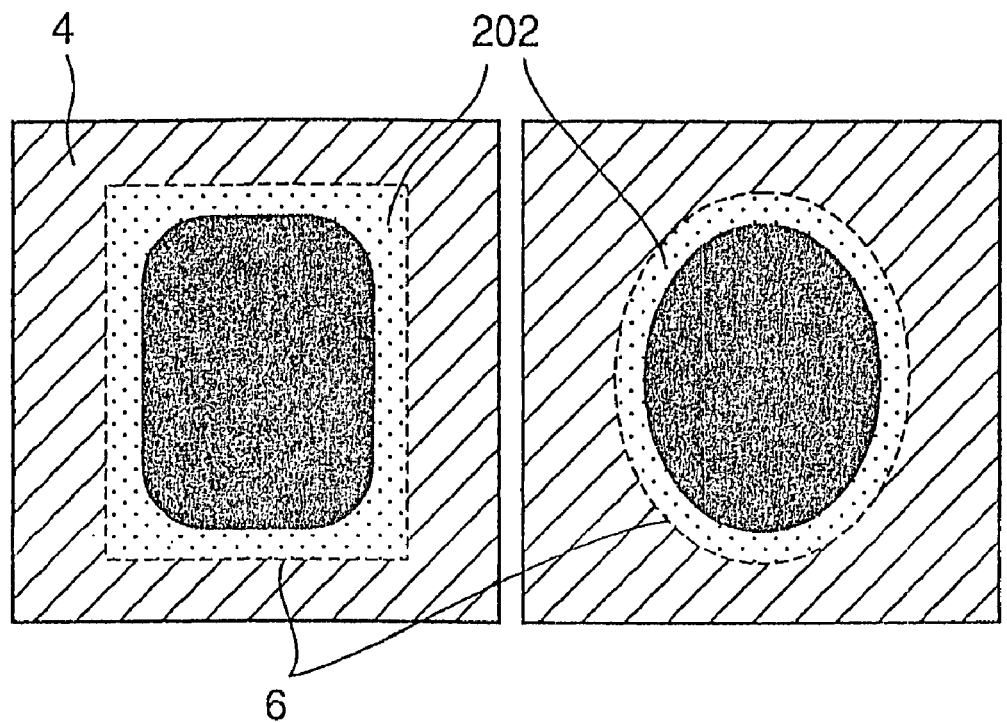
FIG. 9 - PRIOR ART
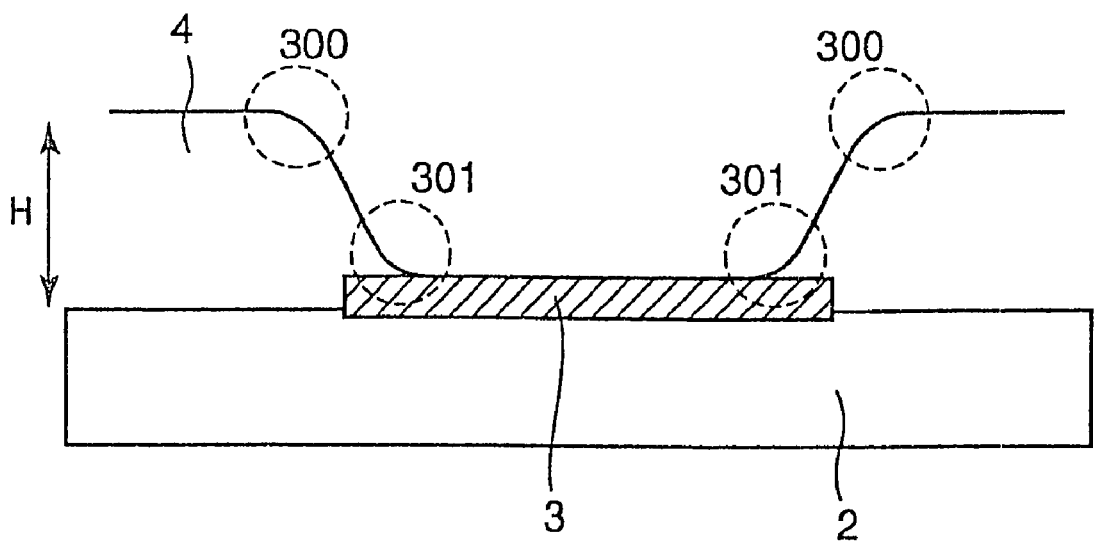
FIG. 10 - PRIOR ART

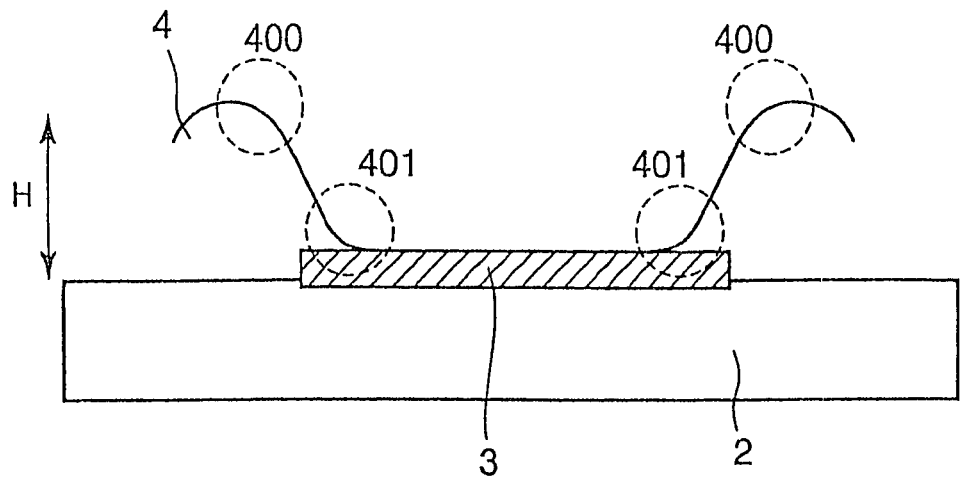
FIG. 11 - PRIOR ART
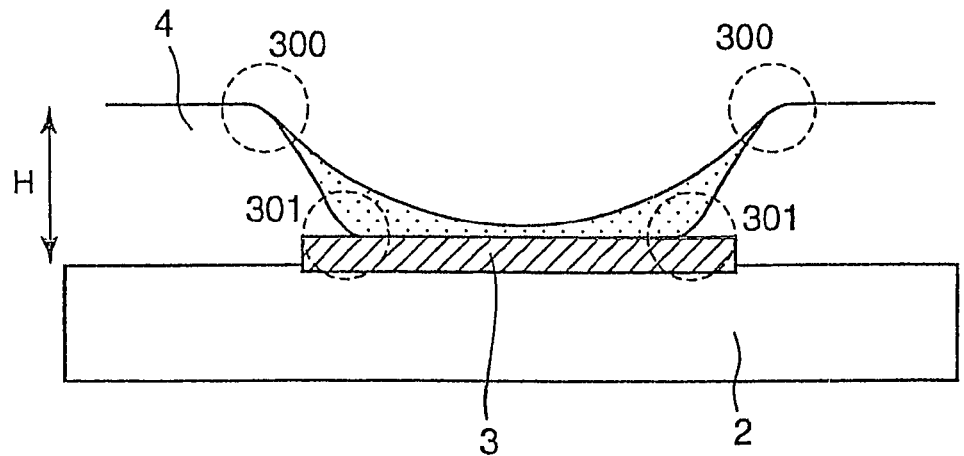
FIG. 12 - PRIOR ART
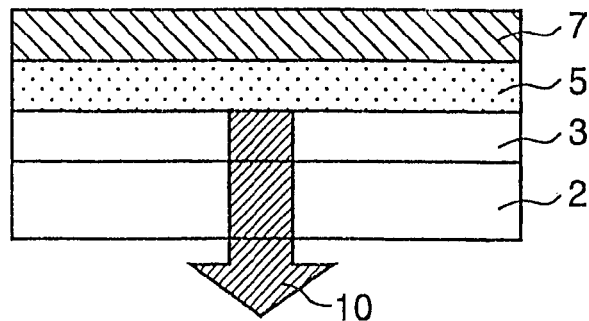
FIG. 13 - PRIOR ART

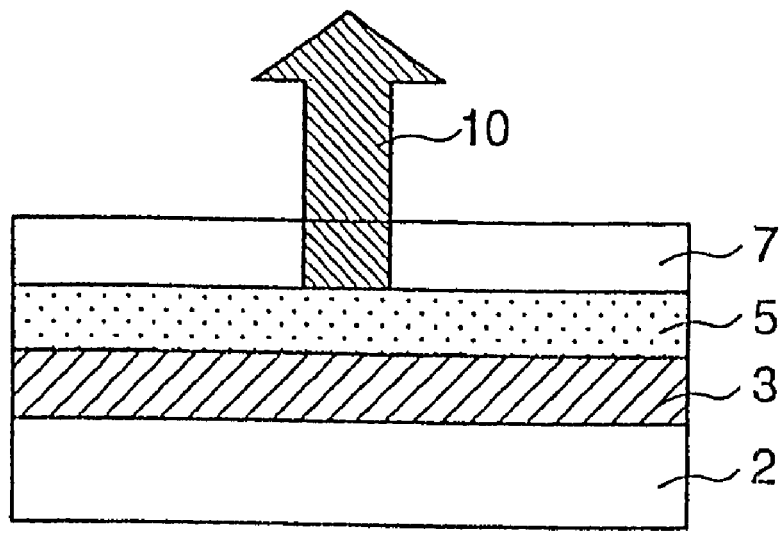
FIG. 14 - PRIOR ART
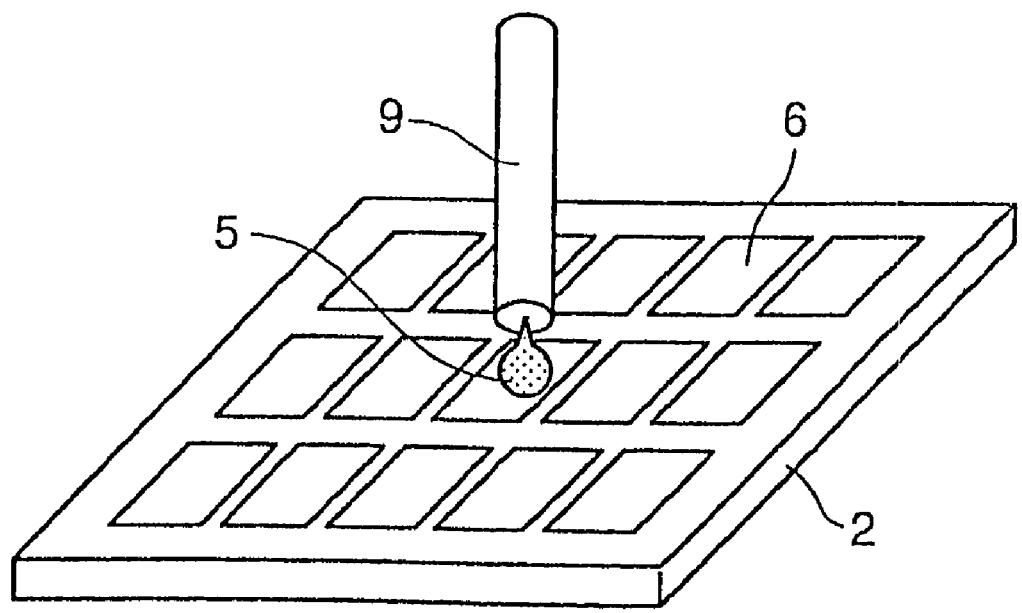
FIG. 15 - PRIOR ART

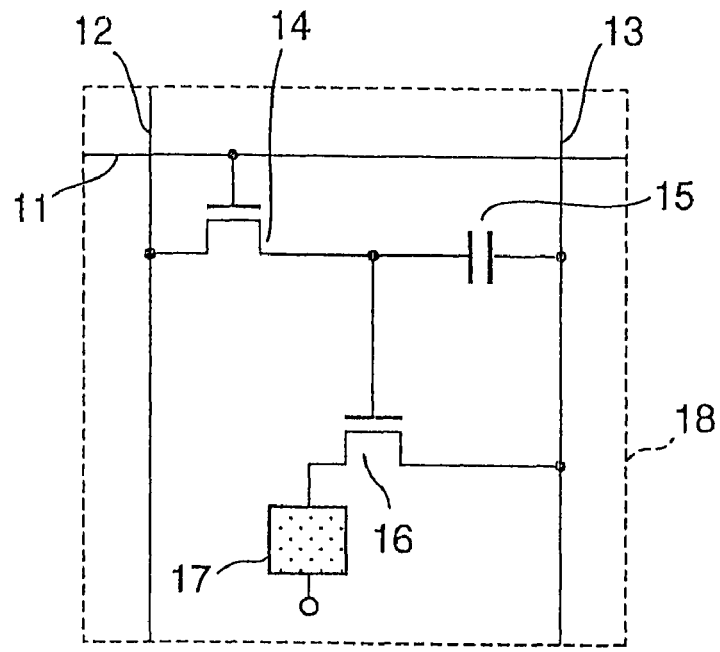
FIG. 16 - PRIOR ART
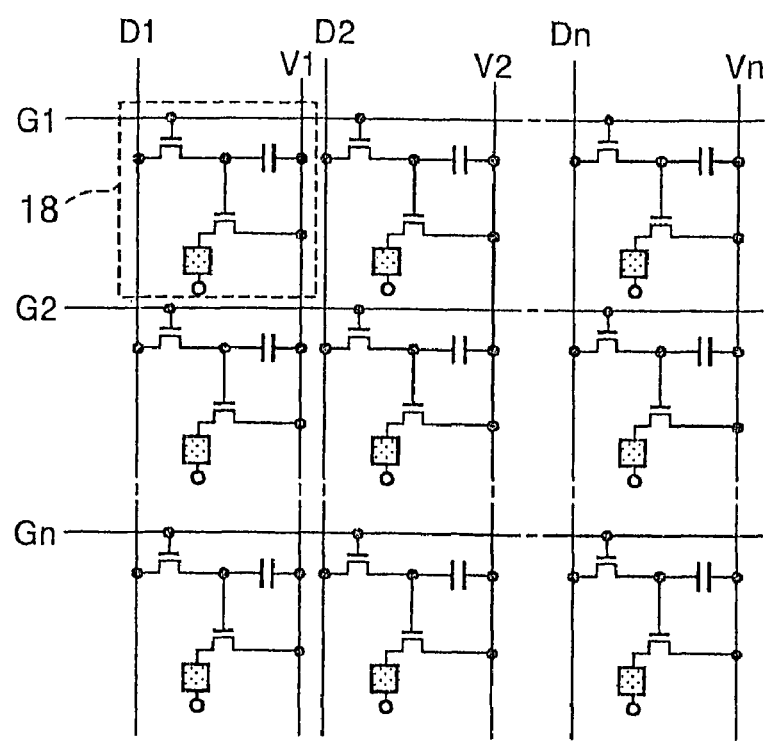
FIG. 17 - PRIOR ART

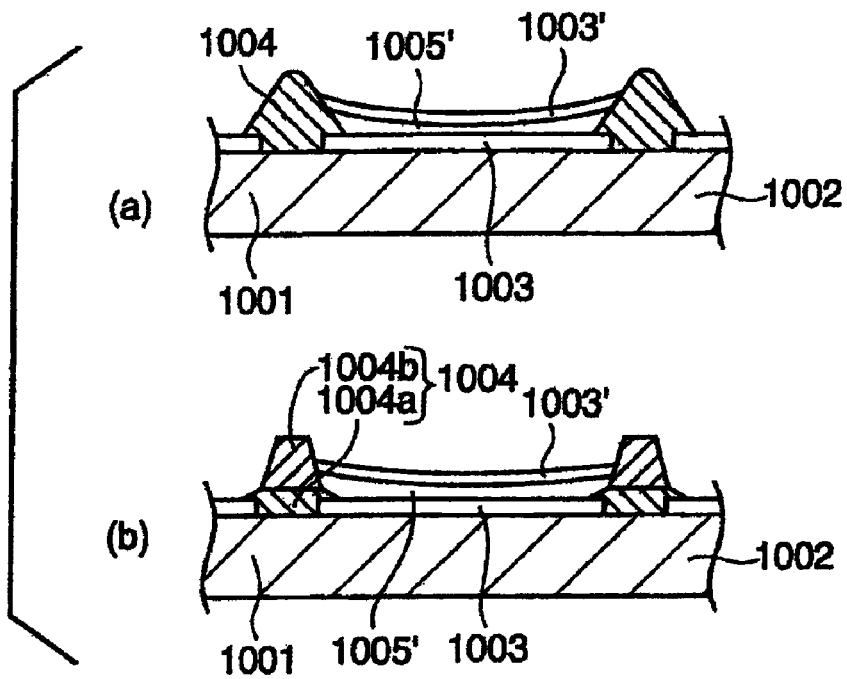
FIG. 26
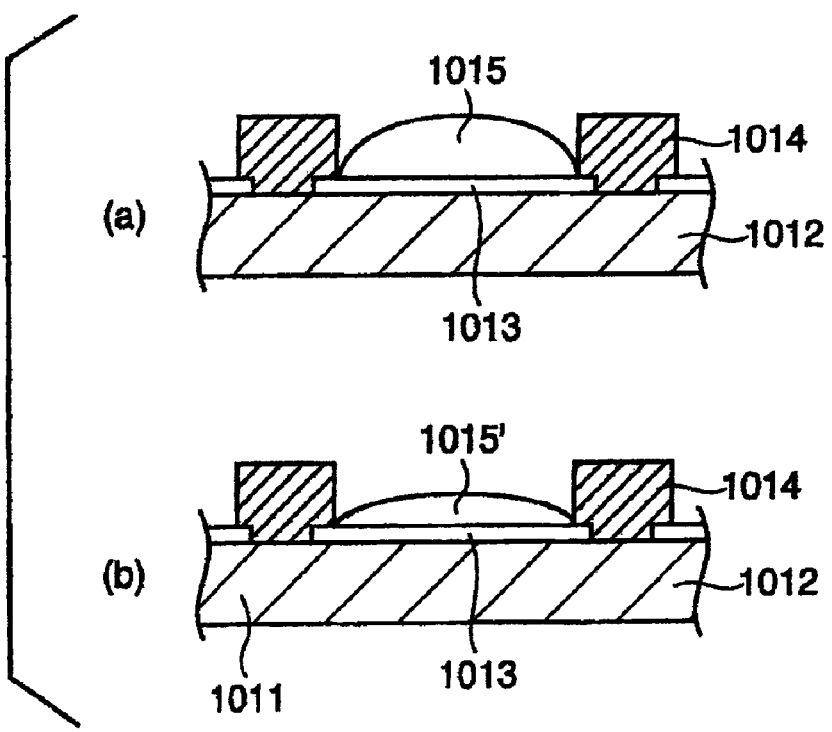
PRIOR ART - FIG. 27

PATTERN FORMED OBJECT FOR AN ELECTROLUMINESCENT DISPLAY

CROSS-REFERENCE TO RELATED APPLICATIONS

This application is a divisional application of U.S. patent application Ser. No. 10/630,089 filed on Sep. 30, 2003, which claims the benefit of Japanese serial number 2002-222296, filed Jul. 31, 2002 and Japanese serial number 2002-230899 filed Aug. 8, 2002. The disclosures of the above applications are incorporated herein by reference.

BACKGROUND OF THE INVENTION

1. Field of the Invention

The present invention relates to an electroluminescent (EL) display and a process for producing the same.

2. Background Art (1) First Aspect of the Invention

In recent years, flat displays have become used in various fields and places, and advance in information technology has rendered flat displays more and more important. At the present time, liquid crystal displays (LCDs) are representative flat displays. The development of organic ELs, inorganic ELs, plasma display panels (PDPs), light emitting diode displays (LEDs), vacuum fluorescent displays (VFDs), field emission displays (FEDs) and the like as flat displays based on a display principle different from that of LCDs are also being energetically made. All of these novel flat displays are displays called self-luminescent type. These self-luminescent displays are greatly different from LCDs in the following points and have excellent properties not possessed by the LCDs.

LCDs are displays called photoreception type. Liquid crystal per se does not emit light and functions as the so-called shutter for permitting the transmission of external light or cutting off the external light to constitute a display. Due to this nature of the liquid crystal, LCDs require the use of a light source, generally backlight. On the other hand, self-luminescent displays per se emit light, and, thus, there is no need to provide a separate light source for emitting light. In the photoreception-type displays like LCDs, backlight is always in a lighted state regardless of the mode of information displayed, and power consumption consumed in non-display state is substantially the same as that in wholly display state. On the other hand, in the self-luminescent displays, power is consumed only in sites necessary for lighting depending upon display information. Therefore, the power consumption is advantageously smaller than that of the photoreception-type displays.

Further, in LCDs, since a dark state is provided by cutting off light from the backlight, it is difficult to completely prevent light leakage. On the other hand, in the self-luminescent displays, non-luminescent state is the dark state. Therefore, an ideal dark state can easily be provided, and, thus, the self-luminescent displays are also much superior to LCDs in contrast.

In LCDs, since polarized light control by taking advantage of birefringence of liquid crystals is utilized, the display state greatly varies depending upon the direction of viewing. That is, the display state is highly dependent upon the view angle. On the other hand, self-luminescent displays are substantially free from this problem.

Further, in LCDs, since a change in orientation derived from dielectric anisotropy of liquid crystals as an organic elastic substance is utilized, theoretically, the time of response to an electric signal is not less than 1 ms. On the other hand, in the above new technology of which the development is being forwarded, electrons/holes, that is, carrier transition, electron release, plasma discharge and the like are utilized. Therefore, the response time is on the order of ns, that is, is much higher than the response speed of LCDs, and, thus, the self-luminescent displays are free from a problem of after image of moving images attributable to the slow response speed of the LCDs.

Among the self-luminescent displays, organic ELs have been particularly energetically studied. Organic ELs are also called "OEL" or "organic light emitting diode (OLED)."

An OEL element and an OLED element have such a construction that a layer containing an organic compound (EL layer) is interposed between a pair of electrodes, an anode and a cathode. A fundamental structure of this element is a laminate structure of "anode electrode/hole injection layer/luminescent layer/cathode electrode" proposed by Tang et al. (Japanese Patent No. 1526026). Tang et al. Japanese Patent No. 1526026 uses a low-molecular material. On the other hand, Nakano et al. Japanese Patent Laid-Open No. 273087/1991 uses a high-molecular material.

Further, an attempt to use a hole injection layer or an electron injection layer has been made to improve efficiency. Furthermore, an attempt to dope a luminescent layer with a fluorescent dye or the like has been made to control colors of emitted light.

The construction of an EL element is generally such that an EL layer is formed on an anode provided for each pixel and a cathode is provided as a common electrode on the EL layer. In this case, the thickness of the anode is large and is about 200 nm from the viewpoint of lowering electric resistance. The EL layer having a small thickness of 30 to 150 nm is formed on the thick anode. Therefore, disadvantageously, breaking of the EL layer occurs on the side face of the anode. Breaking of the EL layer disadvantageously causes shortcircuiting between the anode and the cathode in the broken part. This makes it impossible to exhibit luminescence of the EL layer, and black point defects are formed. In the prior art technique, when the EL layer is formed by the vapor deposition, the thickness of the EL layer in its part located at the boundary between the partition wall and the electrode is smaller than the other parts, and current concentration occurs in this part. In order to solve the problem involved in the prior art technique, that is, the problem of electrode breaking and the problem of the smaller thickness of the EL layer in its part located at the boundary between the partition wall and the electrode, in Yamazaki et al. Japanese Patent Laid-Open No. 164181/2002, as shown in FIGS. 10 and 11, the upper ends 300, 400 of tapered partition walls are convexly curved in section relative to the substrate, and the lower ends 301, 401 of the tapered partition walls are concavely curved in section relative to the substrate. This construction is described to have solved the problem of electrode breaking and the problem of uneven layer thickness.

The present inventor has made experiments using partition walls proposed in the Yamazaki et al. publication. As a result, it was confirmed that the problem of electrode breaking did not occur. However, when the EL layer was formed by an ink jet method, as shown in FIG. 12, the problem of uneven layer thickness became more significant. The reason for this is probably that a liquid reservoir phenomenon occurs in the concavely curved part in the lower end 301 and, due to this phenomenon, attraction of the EL layer ink to the side face of the partition wall is enhanced.

The formation of the EL layer by a wet process has many advantages and is a promising method for the preparation of an organic EL display. However, except for the following complicated Inoue's process, there was no method for evenly controlling the layer thickness. A well-known method for the preparation of an organic EL display is one described in Inoue: "Kara Porima EL Disupurei (Color Polymer EL Display)," Vol. 22, No. 11, O plus E, p. 1433-1440. In this method, as shown in FIG. 5, partition walls 4 are formed on an insulating layer 8. An luminescent material 5 in an ink form is ejected through an ink jet nozzle 9 to put the luminescent material 5 selectively on a pixel opening 6 (FIG. 15). In order to fix the ink of the luminescent material, the pixel opening and the insulating layer are treated to impart hydrophilic nature. The insulating layer is provided for preventing insulation failure between the opposed electrodes caused by electric field concentration at the edge of the electrode, that is, interelectrode leak. Further, as shown in FIG. 5, the partition walls are subjected to water repellency-imparting treatment so that ink droplets not ejected on the pixel opening but impacted on the partition wall are allowed to flow in the pixel opening.

Fujita et al. Japanese Patent Laid-Open No. 351787/2001 proposes an organic EL element having partition walls similar to the partition walls described in Yamazaki et al. document. The partition wall has a foot part having a triangle-, trapezoid- or arc-like tapered shape around the electrode, and the foot part is concavely curved. The EL layer is formed by a printing method. What is referred to in the Fujita et al. publication is electrode breaking at the lower ends 301, 401 in the Yamazaki's display, and the Fujita et al. publication is silent on the evenness of the layer thickness. FIGS. 2 (a), (b) and (c) in Japanese Patent Laid-Open No. 351787/2001, however, shows the bulged shape of the EL layer along the side face of the partition wall. Thus, the problems to be solved by the present invention remain unsolved.

Under these circumstances, the present invention has been made, and an object of the present invention is to provide an organic electroluminescent display having excellent practicality that can be produced by a simple method which does not cause electrode breaking and can realize even thickness of an electroluminescent layer.

(2) Second Aspect of the Invention

An electroluminescent (EL) element includes a pair of opposed electrodes. A luminescent layer containing an organic fluorescent coloring matter, optionally together with other layers such as a hole injection layer, is interposed between the pair of electrodes. In this EL element, upon recombination of electrons and holes provided in the luminescent layer, energy is generated. The energy excites the phosphor in the luminescent layer to emit light. In the EL element, a reduction in thickness and a reduction in weight can be realized. Further, the EL element has high brightness and is also suitable for the display of moving images. Therefore, the development of EL elements for various display applications have been forwarded.

In a general EL element, in general, three types of luminescent layers different from one another in color of luminescence should be regularly arranged. To this end, various methods have been studied. A currently commonly employed method is to form the luminescent layer by an ink jet method using a coating liquid for luminescent layer formation. In order to prevent the formation of the luminescent layer in an area other than the predetermined area, a partition wall is provided between adjacent pixels so that the coating liquid for the formation of a luminescent layer, which exhibits luminescence of a specific color, is applied only in the inside of a space surrounded by the partition walls.

Japanese Patent Laid-Open No. 323276/2000 discloses a pattern formed object as shown in FIG. 27. Specifically, a partition wall 1014 formed of a photosensitive polyimide or the like is provided between pixel electrodes 1013 of ITO film or the like provided on a transparent substrate 1012. The assembly is subjected to continuous plasma treatment of oxygen gas plasma and fluorocarbon gas plasma to render the surface of the electrode hydrophilic and to render the surface of the partition wall 1014 water-repellent. Both a hole injection layer and a luminescent layer are formed by an ink jet method to form a pattern formed object (an element) 1011. Since, however, the surface of the partition wall 1014 of polyimide has been rendered water-repellent, upon the application of the coating liquid by the ink jet method, the partition wall 1014 repels the coating liquid 1015. Therefore, as shown in FIG. 27A, the application of the coating liquid 1015 in its center part is in a bulged state. Thus, a coating (a luminescent layer) 1015', in which the center of the pixel is in a bulged state, is formed. In this coating (luminescent layer) 1015' (FIG. 27B), the concentration of an electric field occurs in a relatively thin layer part. This leads to a drawback that only the peripheral part of the luminescent layer along the partition wall exhibits luminescence.

Japanese Patent Laid-Open No. 351787/2001 discloses that the part around the partition wall, in which the luminescent layer is not formed, can be significantly reduced by providing partition walls having a tapered foot part in which the surface of the foot part is concavely curved in section. In the formation of the partition walls, however, although only some description on materials for black matrix (chromium and resin black are described as an example; and a resist is used in the working example) is found, there is no specific description on the formation of the unique shape in the foot part of the partition wall. Therefore, reproduction of the partition wall is difficult.

Japanese Patent Laid-Open No. 148429/2002 discloses that, when the partition walls are subjected to both roughening treatment (to provide Ra about 3 to 50 nm) and plasma treatment using fluorine element-containing gas, the ink adhesion can be improved by the former treatment to reduce the level of bulge and, thus, it is possible to provide such a sectional form that the level of bulge of the center part is small, the height of the peripheral part is high, and the layer thickness other than that of the peripheral part is uniform. However, in addition to the fact that the bulge in the center part is not fully removed, the height of the coating at the peripheral part becomes large. Therefore, a part, located somewhat inward from the peripheral part, has a smaller layer thickness. Further, since the maximum layer thickness and the minimum layer thickness are within ±25% of the average layer thickness, disadvantageously, for example, only a part near the partition wall exhibits luminescence, or otherwise luminescence is exhibited only in a narrowed region.

Further, in the above methods described in Japanese Patent Laid-Open Nos. 323276/2000 and 148429/2002, since the partition walls are liquid-repellent, a hole injection layer, which is in many cases provided together with the luminescent layer, is less likely to be evenly formed. Unlike the luminescent layer, in the formation of the hole injection layer, there is no need to change color of luminescence for each pixel, and the hole injection layer may be formed on the whole area.

Accordingly, an object of the present invention is to provide a pattern formed object having a coating as an electroluminescent layer or the like having even thickness, for an electroluminescent element, formed using a coating liquid and provided in each area surrounded by partition walls provided on a substrate provided with partition walls.

SUMMARY OF THE INVENTION (1) First Aspect of the Invention

The above object of the present invention can be attained by an electroluminescent display comprising at least a substrate, an electrode provided on the substrate, protrusions which each are provided on the substrate so as to cover the ends of the electrode and are convexly curved in section relatively to the surface of the substrate, and an electroluminescent layer provided in each opening which is located on the electrode and defined by adjacent protrusions.

Further, the present invention provides a process for producing an electroluminescent display, comprising the step of forming an organic layer including at least an electroluminescent layer on the surface of the above substrate with protrusions provided thereon by a wet process selected from an ink jet method, a printing method, a casting method, an alternating adsorption method, a spin coating method, a dipping method, and a dispenser method.

Furthermore, the present invention provides an electronic equipment comprising the above display as a display part.

According to the present invention, a display having excellent practicality can be provided by a process, which is simpler than the prior art process, involving the formation of a uniform coating using a coating liquid of an organic electroluminescent material, for example, a high-molecular organic electroluminescent material or a coating-type low-molecular organic electroluminescent material. Further, the present invention can provide an electronic equipment having excellent practicality provided with this display.

(2) Second Aspect of the Invention

As a result of extensive and intensive studies, the present inventor has found that the provision of partition walls having sloped side faces like banks in rivers is advantageous in that, even when the height of the surface of the coating as the luminescent layer in its part located on the slope of the partition wall is large, the thickness of the coating in its luminescent part can be made even because the coating in its part located on the partition wall does not exhibit luminescence by virtue of the positional relationship between the coating and the electrode. The present invention has been made based on such finding.

EMBODIMENTS OF THE INVENTION (1) A pattern formed object comprising:

a substrate;

partition walls provided on the substrate; and a coating stacked on the substrate in its part between the partition walls, wherein said partition walls have a liquid-nonrepellent surface and
have such a sectional form that, at least in the lower part of the partition wall, as the distance from the substrate increases, the size of the partition wall in a direction parallel to the substrate decreases, and in said coating, the ratio of the maximum thickness (Tmax) to the minimum thickness (Tmin), Tmax/Tmin, is not more than 130% as measured in the coating in its part between the lower ends of the partition walls adjacent to each other.

(2) The pattern formed object according to the above item (1), wherein the angle of the lower part of the partition wall to the substrate is not more than 60 degrees.

(3) The pattern formed object according to the above item (2), wherein each of the partition walls comprises a lower partition wall structure, which is provided on the substrate side and is in the form of a trapezoid, in section, with the long side being located on the substrate side, and an upper partition wall structure provided on the lower partition wall structure.

(4) The pattern formed object according to the above item (3), wherein the angle of the slope of the lower partition wall structure to the substrate is not more than 30 degrees.

(5) The pattern formed object according to the above item (3) or (4), wherein the distance between the lower part of the upper partition wall structure and the end of the lower partition wall structure on its substrate side as measured in a direction parallel to the substrate is not less than 1 µm.

(6) The pattern formed object according to any one of the above items (3) to (5), wherein the height $H_1$ of the lower partition wall structure as measured in a direction perpendicular to the substrate and the height $H_2$ of the upper partition wall structure satisfy a requirement represented by $H_2 > 2 \times H_1 > 0.1$ µm.

(7) A pattern formed object for an electroluminescent element, comprising the pattern formed object according to any one of the above items (1) to (6), said coating being an EL light emitting layer sandwiched between a first electrode and a second electrode.

(8) The pattern formed object for an electroluminescent element according to the above item (7), wherein said EL light emitting layer has a hole injection layer stacked on its substrate side.

(9) A method for pattern formation, comprising the steps of:

forming, on a substrate, partition walls which have a liquid-nonrepellent surface and have such a sectional form that, at least in the lower part of the partition wall, as the distance from the substrate increases, the size of the partition wall in a direction parallel to the substrate decreases;

applying a coating liquid onto the substrate in its part between the partition walls adjacent to each other; and drying and solidifying the coating to form a solidified coating of which the ratio of the maximum thickness (Tmax) to the minimum thickness (Tmin), Tmax/Tmin, is not more than 130% as measured in the coating in its part between the lower ends of the partition walls adjacent to each other.

(10) The method for pattern formation according to the above item (9), wherein said partition wall is formed by forming a lower partition wall structure, which is provided on the substrate side and is in the form of a trapezoid, in section, with the long side being located on the substrate side, and then forming an upper partition wall structure provided on the lower partition wall structure.

(11) A method for pattern formation for an electroluminescent element, comprising the steps of:

forming a first electrode on a substrate;

forming partition walls according to the method as defined in the above item (9) or (10);

forming a coating as an EL light emitting layer using a coating liquid for EL light emitting layer formation according to the method as defined in the above item (9) or (10); and forming a second electrode on the EL light emitting layer.

(12) The method for pattern formation for an electroluminescent element according to the above item (11), wherein the coating liquid for EL light emitting layer formation is applied by a dispenser method or an ink jet method.

(13) The method for pattern formation for an electroluminescent element according to the above item (11) or (12), wherein, prior to the formation of the EL light emitting layer, a hole injection layer is formed between the partition walls adjacent to each other.

(14) The method for pattern formation for an electroluminescent element according to the above item (11) or (12), wherein, prior to the formation of the EL light emitting layer, a hole injection layer is formed on the whole area of the assembly including the upper surface of the partition walls.

According to the present invention, the following effects can be attained.

According to the pattern formed object in the above item (1), since the partition walls are liquid-nonrepellent, the pattern formed object is free from a problem that the coating in its center portion is in a bulged state. Specifically, as the distance from the substrate decreases, the thickness of the partition wall increases. That is, as the distance from the substrate increases, the thickness of the partition wall decreases. Since both sides of the partition wall are sloped, a pattern formed object can be provided in which the occurrence of uneven thickness of the coating has been prevented.

According to the pattern formed object in the above item (2), in addition to the effect attained by the above item (1), the occurrence of the uneven thickness of the coating can be further effectively prevented.

According to the pattern formed object in the above item (3), in addition to the effect attained by the above item (2), the function of the partition wall can be shared between the first partition wall structure and the second partition wall structure. Therefore, the pattern formed object has an enhanced function.

According to the pattern formed object in the above item (4), since the lower partition wall structure has a more gently sloped surface, the unevenness of the thickness of the coating can be further reduced.

According to the pattern formed object in the above item (5), since the lower limit of the size of the gently sloped surface of the lower partition wall structure has been specified, in addition to the effect attained by the above item (3) or (4), the effect of the gently sloped surface can be further improved.

According to the pattern formed object in the above item (6), since the relationship between the height of the lower partition wall structure and the height of the upper partition wall structure and the lower limit of the absolute value of the height of the lower partition wall structure and the lower limit of the absolute value of the height of the upper partition wall structure have been specified, the function of the lower partition wall structure and the function of the upper partition wall structure can be satisfactorily exhibited.

According to the pattern formed object for an electroluminescent element in the above item (7), the coating as the EL light emitting layer is interposed between the first and second electrodes. By virtue of this construction, in addition of the effect attained by any one of the above items (1) to (6), a problem can be solved that, based on the coating having even thickness, the luminescent layer within each of the partition walls partially exhibits luminescence without luminescence in the whole luminescent layer.

According to the pattern formed object for an electroluminescent element in the above item (8), in addition to the effect attained by the above item (7), an additional effect can be attained by the coating as the EL light emitting layer provided with the evenly formed hole injection layer.

According to the method for pattern formation for an electroluminescent element in the above item (9), after liquid-nonrepellent partition walls are formed, a coating liquid is applied to a portion between the partition walls, Therefore, the coating formed between the partition walls is free from a problem that the coating in its center portion is in a bulged state. Specifically, as the distance from the substrate decreases, the thickness of the partition wall increases. That is, as the distance from the substrate increases, the thickness of the partition wall decreases. Therefore, in this method, uneven thickness of the coating is less likely to occur.

According to the method for pattern formation in the above item (10), in addition to the effect attained by the above item (9), the function of the partition wall can be shared between the first partition wall structure and the second partition wall structure. Therefore, the function of the partition wall can be enhanced.

According to the method for pattern formation for an electroluminescent element in the above item (11), in addition to the effect attained by the above item (9) or (10), the first and second electrodes are formed to interpose the coating as the EL light emitting layer therebetween. Therefore, a problem can be solved that, based on the coating having even thickness, the luminescent layer within each of the partition walls partially exhibits luminescence without luminescence in the whole luminescent layer.

According to the method for pattern formation for an electroluminescent element in the above item (12), the coating liquid for EL light emitting layer formation is applied by a dispenser method or an ink jet method. Therefore, in addition to the effect attained by the above item (10) or (11), the coating liquid can be accurately applied to a portion between the partition walls adjacent to each other.

According to the method for pattern formation for an electroluminescent element in the above item (13), prior to the formation of the EL light emitting layer, the hole injection layer is formed. Therefore, in addition to the effect attained by the above item (11) or (12), an additional effect can be attained by the EL light emitting layer provided with the hole injection layer.

According to the method for pattern formation for an electroluminescent element in the above item (14), the hole injection layer is formed on the whole area of the assembly including the upper surface of the partition walls. Therefore, in addition to the effect attained by the above item (11) or (12), an additional effect can be attained by the EL light emitting layer provided with the hole injection layer.

BRIEF DESCRIPTION OF THE DRAWINGS

FIG. 3 is an enlarged cross-sectional view showing the construction of a display in another embodiment of the present invention;

FIG. 4 is a cross-sectional view showing the construction of a conventional display;

FIG. 5 is a cross-sectional view showing the construction of a conventional display;

FIG. 6 is a cross-sectional view showing the construction of a conventional display;

FIG. 7 is a front view illustrating luminescence in pixels in display using a conventional display;

FIG. 8 is a cross-sectional view showing the construction of another conventional display;

FIG. 9 is a front view illustrating luminescence in pixels in display using the conventional display shown in FIG. 8;

FIG. 10 is a cross-sectional view showing the construction of an improved conventional display;

FIG. 11 is a cross-sectional view showing the construction of another improved conventional display;

FIG. 12 is a cross-sectional view showing the construction of an improved conventional display produced by a wet process;

FIG. 13 is a cross-sectional view showing the construction of an organic electroluminescent element;

FIG. 14 is a cross-sectional view showing the construction of another organic electroluminescent element;

FIG. 15 is a diagram illustrating a production method of an organic electroluminescent display by an ink jet method;

FIG. 16 is a circuit diagram showing the construction of a pixel in an active drive organic electroluminescent display;

FIG. 17 is a diagram showing the construction of matrix pixels in an active drive organic electroluminescent display;

FIG. 26 is a diagram showing an example of the application of a pattern formed object to an electroluminescent element;

FIG. 27 is a diagram showing a conventional pattern formed object;

FIGS. 30A and 30B are diagrams of an EL element with partition walls formed therein in Example B1;

FIGS. 31A and 31B are diagrams of an EL element with first partition walls formed therein in Example B2; and FIGS. 32A and 32B are diagrams of an EL element with first and second partition walls formed therein in Example B2.

In FIGS. 1 to 32,

1: display part, 2: substrate, 3: electrode, 4: partition wall, 5: EL layer, 6: opening, 7: counter electrode, 8: insulating layer, 9: nozzle, 10: luminescence, 11: scanning line G, 12: data signal line D, 13: power supply line V, 14: switching TFT, 15: gate holding capacitor, 16: EL drive TFT, 17: EL element, 18: pixel, 19: operating part, 20: equipment, 21: lens, 1001: pattern formed object (EL element), 1002: substrate, 1003: electrode (1031: first electrode, 1032: second electrode), 1004: partition wall (1004a: lower partition wall structure, 1004b: upper partition wall structure), 1005: coating liquid (1005': coating), 1051: coating liquid for hole injection layer formation (1051': hole injection layer), 1052-1054: coating liquid for luminescent layer formation (1052'-1054': luminescent layer), and 1006: mask pattern.

DETAILED DESCRIPTION OF THE INVENTION (1) First Aspect of the Invention

Embodiments of the present invention will be described with reference to the accompanying drawings.

Figure 1:
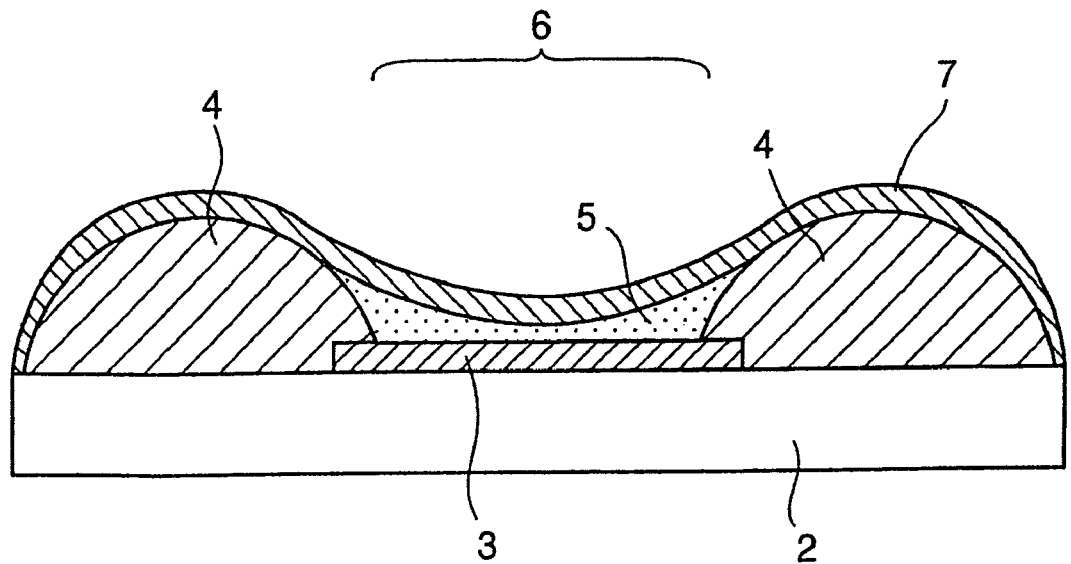
FIG. 1 is a cross-sectional view showing the construction of a display in an embodiment of the present invention.
Figure 2:
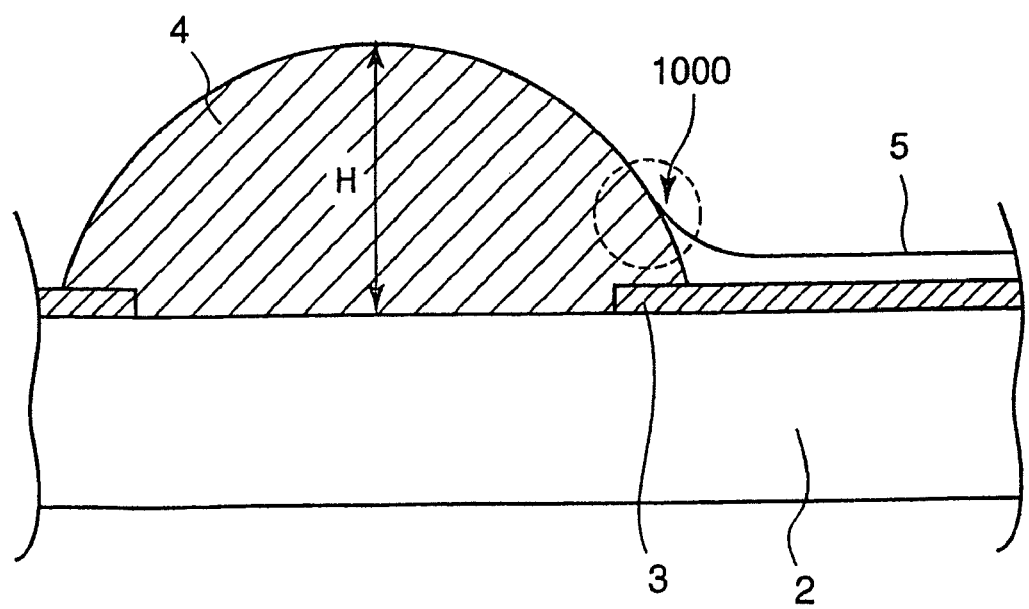
FIG. 2 is an enlarged cross-sectional view showing the construction of a display in an embodiment of the present invention.

FIG. 1 is a cross-sectional view showing the construction of a display in an embodiment of the present invention, FIG. 2 an enlarged cross-sectional view showing the construction of a display in an embodiment of the present invention, and FIG. 3 an enlarged cross-sectional view showing the construction of a display in another embodiment of the present invention.

Figure 18:
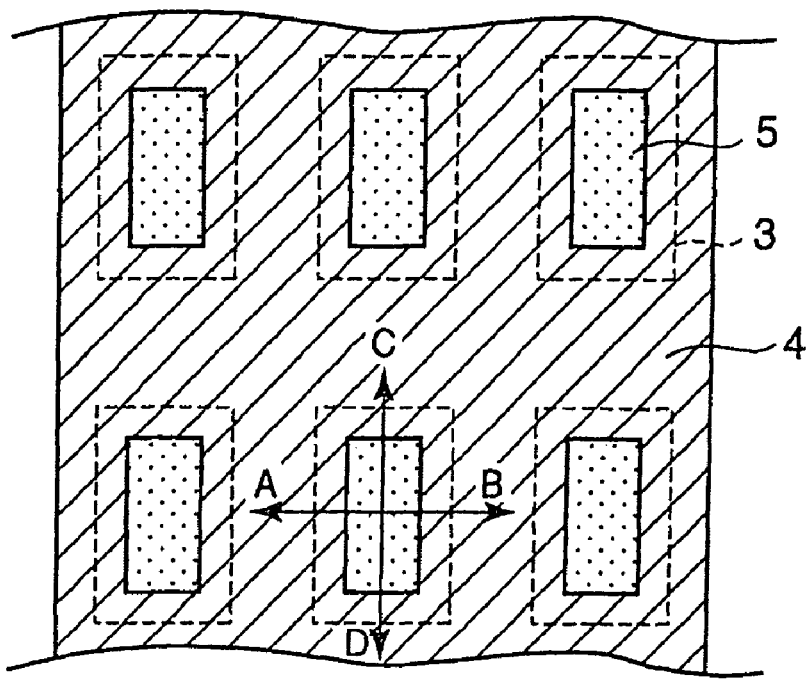
FIG. 18 is a front view showing an example of the arrangement of pixels in a display according to the present invention.

In forming an electroluminescent layer by an ink jet recording method, a commonly employed method is to eject dots of an electroluminescent material ink for each pixel. Thus, pixels arranged as shown in FIG. 18 are formed. In this case, the electroluminescent layer is formed on a substrate provided with an electrode and a partition wall. FIGS. 1, 2, and 3 are cross-sectional views taken on line A-B or C-D of FIG. 18.

Figure 19:
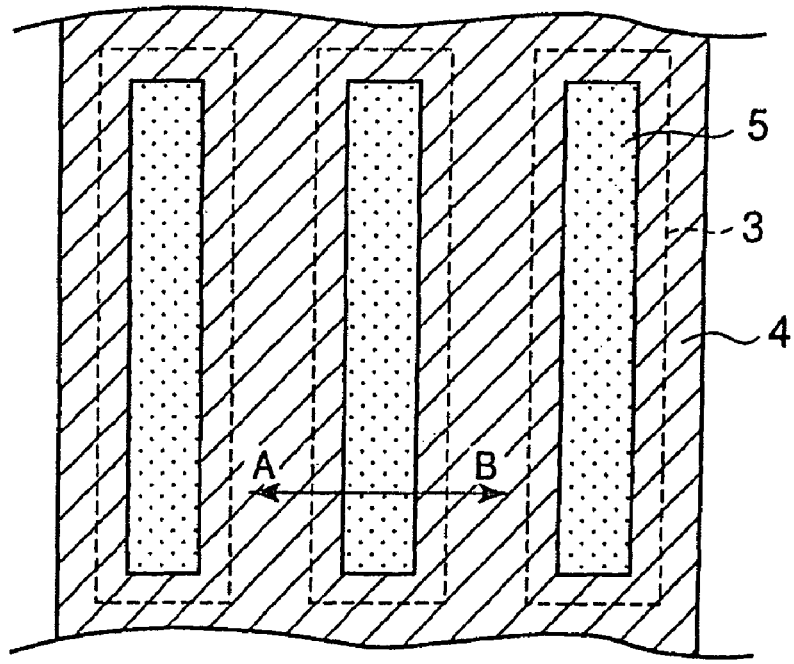
FIG. 19 is a front view showing another example of the arrangement of pixels in a display according to the present invention.

When an electroluminescent layer is formed so that a plurality of pixels adjacent to each other emit the same color, for example, in data lines in a passive matrix display, as well as in data lines even in an active matrix display in a striped pixel arrangement, the same electroluminescent color may be adopted. In this case, as shown in FIG. 19, the opening of the partition wall is also formed in a line form, and the electroluminescent layer may be formed by an ink jet recording method or alternatively may be formed by the so-called dispenser method.

Figure 20:
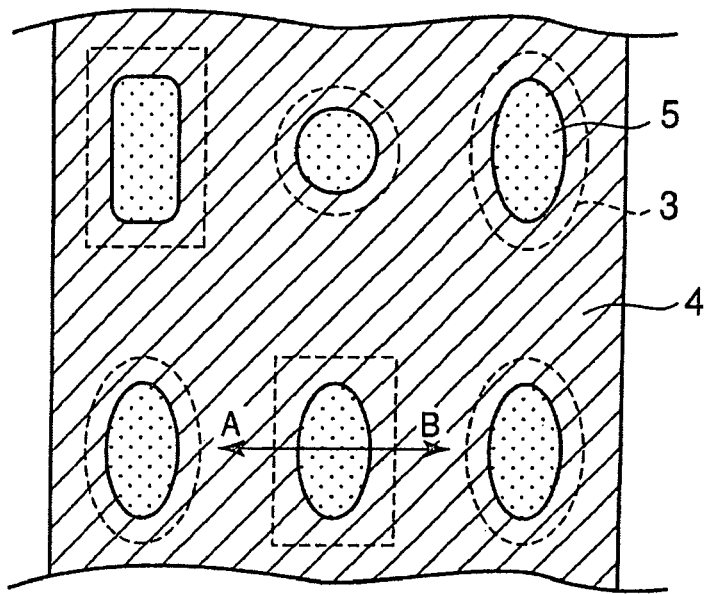
FIG. 20 is a front view showing a further example of the arrangement of pixels in a display according to the present invention.

In the formation of the electroluminescent layer by the ink jet recording method using ink solutions, the shape of pixels is also important. When the pixels to be formed have a corner part as shown in FIGS. 18 and 19, there is a tendency that the ink solution cannot form an accurate corner part but a broken corner. Therefore, as shown in FIG. 20, the opening of the pixel is preferably in an elliptical or circular form which does not have any corner part so that surface tension acts evenly. More preferably, the partition wall is formed in this way.

In the present invention, a pixel electrode and a counter electrode constitute a pair of electrodes, any one of which is an anode and the other a cathode. All layers provided between the pair of electrodes are collectively called "EL layer." The EL layer includes the hole injection layer, the hole transport layer, the electroluminescent layer, the electron transport layer, and the electron injection layer as described above.

FIG. 13 is a cross-sectional view showing the structure of an organic EL element.

Organic EL emits light upon the application of an electric field across electrodes to allow current to flow in the EL layer. The prior art technique utilizes only fluorescence caused upon a transition from a singlet excited state to a ground state. Recent research, however, has realized effective utilization of phosphorescence caused upon a transition from a triplet excited state to a ground state. This has contributed to a considerable improvement in luminescence efficiency.

The organic EL is generally produced by forming a light transparent electrode 3 on a light transparent substrate 2, such as a glass substrate or a plastic substrate, and then forming an EL layer 5 and a counter electrode 7 in that order. In many cases, the anode is a light transparent electrode formed of ITO or the like, and the cathode is a light non-transparent electrode formed of a metal.

The organic EL element undergoes a significant deterioration in properties upon exposure to moisture or oxygen. To cope with this and to ensure reliability, a method is adopted wherein, in order to avoid the exposure of the element to moisture or oxygen, in general, the element is filled with inert gas while using another substrate (not shown in FIG. 13), or the so-called sealing is carried out by thin film deposition (not shown in FIG. 13).

As with LCDs, displays using organic EL elements can be classified roughly into a passive matrix system and an active matrix system according to electrode construction and driving methods. In the passive matrix system, a pair of electrodes are constituted by a horizontal electrode and a vertical electrode which sandwich the EL layer therebetween and cross each other. The passive matrix system is advantageously simple in structure, but on the other hand, for the display of images, the instantaneous brightness should be enhanced by time division scanning by a value obtained by multiplying the brightness by the number of scanning lines. In a display having better performance than conventional VGA, an instantaneous brightness exceeding 10,000 cd/m$^2$ is required of organic EL, and, thus, the display involves many practical problems. On the other hand, in the active matrix system, a pixel electrode is formed on a substrate with TFT or the like formed thereon, and an EL layer and a counter electrode are then formed. The active matrix system is advantageous as an organic EL display in various points, for example, in terms of luminescence brightness, power consumption, and crosstalk, although the active matrix system has a more complicated structure than the passive matrix system.

Further, in the case of active matrix displays using a polycrystalline silicon (polysilicon) film or a continuous grain boundary silicon (CG silicon) film, the charge mobility in the polysilicon film or the CG silicon film is higher than that in an amorphous silicon film. Therefore, heavy current processing of TFT is possible, and this renders the active matrix system suitable for driving organic EL which is a current drive element. Further, in polysilicon TFT and CG silicon TFT, high-speed operation is possible. Therefore, unlike the prior art technique in which processing was carried out by external IC, various control circuits and display pixels may be provided on an identical substrate. This can offer various advantages such as a size reduction in display, a reduction in cost, and realization of multifunctions.

FIG. 16 is a diagram showing the construction of a typical pixel circuit of an active matrix organic EL display. The pixel circuit includes a scanning line G 11, a data signal line D 12, each bus line of a power supply line V 13 and, further, switching TFT 14, a gate holding capacitor 15, driving TFT 16, and an EL element 17. A gate of the switching TFT selected by the scanning line G is opened, and a signal voltage corresponding to luminescence intensity is applied to a TFT source through the data signal line D. This permits the gate of the driving TFT to be analogically opened according to the level of the signal voltage, and this state is held in the gate holding capacitor. Upon the application of voltage through the power supply line V to a source of the driving TFT, a current corresponding to the degree of opening of the gate is allowed to flow in the EL element. As a result, luminescence takes place in a gradation manner depending upon the level of the signal voltage. FIG. 17 is a diagram showing the construction of an actual active drive organic EL display in which 18 pixels are arrayed in a matrix form.

For organic EL displays, additional circuit constructions and driving methods include digital gradation driving methods, for example, a construction using an increased number of TFTS (Yumoto et al.: "PixEL-Driving Methods for Large-Sized Poly-Si AM-OLED Displays," Asia Display/IDW, '01 p. 1395-1398); time division gradation (Mizukami et al.: "6-bit Digital VGA OLED," SID, '00 p. 912-915); and area division gradation (Miyashita et al.: "Full Color Displays Fabricated by Ink-Jet Printing," Asia Display/IDW, '01 p. 1399-1402). In the present invention, any of these techniques may be used.

Also for the passive matrix system, in the case of a simple display which is small in the number of scanning lines, a practical device can be realized by utilizing the simple structure. Further, the development of phosphorescence emitting materials in addition to conventional fluorescence emitting materials has been forwarded. By virtue of this, the luminescence efficiency has been significantly improved. The utilization of these materials, which can realize high luminescence efficiency, leads to a possibility that conventional problems involved in the passive matrix system can be solved.

As shown in FIG. 14, studies on a top emission structure, in which luminescence 10 is taken out from the electroluminescent element in its side remote from the substrate, is also being forwarded. Against the top emission structure, the structure shown in FIG. 13 is sometimes called "bottom emission structure." In the top emission structure particularly in an active matrix display, the luminescent area ratio is not limited by circuit construction such as TFT and bus line, and more functional and complicated circuits can be formed. Therefore, the development of the top emission structure is being forwarded as a promising technique for future applications.

In the present invention, any of the above techniques may be used in organic EL.

Methods for achieving color display include: a three-color juxtaposition method wherein organic EL materials for three primary colors, R, G, and B, are accurately arranged for each pixel in a display; a CF method wherein a white luminescent layer and color filters (CF) for three colors of R, G, and B are combined; and a CCM (color changing medium) method wherein a blue luminescent layer and fluorescence conversion dye filter for R and G are combined.

The methods for achieving color display will be compared. In the CF method, a white electroluminescent material is necessary. Regarding the white electroluminescent material, apparent white organic EL materials for lighting applications have been realized. However, true white organic EL materials with a spectrum of three colors of R, G, and B have not been realized yet. Further, since color filters are used, the utilization of luminescence is disadvantageously reduced to one-third of the utilization of luminescence in the case where no color filter is used.

In the CCM method, since only a blue electroluminescent material is used, the luminescence efficiency and the efficiency of conversion to R and G by the CCM filter are important. Since, however, satisfactory efficiency cannot be achieved without difficulties, the CCM method has not yet been put to practical use. In CF-type LCDs, the reproduction of television video images is difficult. In the electroluminescent display, as with the CF-type LCDs, the CF method is unsatisfactory in color reproduction. The CCM method is also a kind of filter method and thus is unsatisfactory in color reproduction. On the other hand, in the three-color juxtaposition method, superior color reproduction is provided by subtly regulating the composition of electroluminescent materials of individual colors. Overall, the three-color juxtaposition method is more advantageous than the CF method and the CCM method, because, in the CF method and the CCM method, due to the use of color filters, for example, the thickness of the element is large and the number of necessary components is large.

When low-molecular materials are used, the three-color juxtaposed fine pixels are formed by vacuum deposition with a mask. On the other hand, in the case of high-molecular materials, solutions are prepared therefrom, and the three-color juxtaposed fine pixels are formed by an ink jet method or other printing method or by a transfer method. In recent years, coatable low-molecular materials have also been developed.

In color displays using the three-color juxtaposition method, the vacuum deposition of the low-molecular material with a mask is disadvantageous in that meeting a demand for an increase in size is difficult due to limitations on a vacuum device and a mask for vapor deposition and, in addition, the preparation of a large number of displays using large substrates is difficult. This means that the vacuum deposition of a low-molecular material with a mask poses no problem in the preparation of prototype electroluminescent displays in a development stage, but on the other hand, in a full-scale production stage, it is difficult to meet the request of the market from the viewpoints of tact and cost. On the other hand, in high-molecular materials and coatable low-molecular materials, a film can be formed by a wet process such as ink jetting, printing, casting, alternating adsorption, spin coating, or dipping. Therefore, the above problem of coping with large substrates is not significant. In particular, the ink jetting can realize the preparation of high-definition displays and thus can be said to be the most promising method for future applications.

In the vacuum deposition using a mask, in selectively placing the electroluminescent material on the pixel part, the major part of the electroluminescent material is deposited on the mask. As a result, disadvantageously, the utilization of the electroluminescent material is significantly lowered.

On the other hand, the ink jet method is a method with the highest material utilization, because the electroluminescent material can be selectively disposed only on the required pixel part.

Methods for preparing an organic EL display by an ink jet method will be described.

A well-known ink jet method is described in Inoue: "Kara Porima EL Disupurei (Color Polymer EL Display)," Vol. 22, No. 11, O plus E, p. 1433-1440. According to this method, a partition wall 4 is formed on an insulating layer 8 as shown in FIG. 5. An electroluminescent material 5 in an ink form is ejected through an ink jet nozzle 9 and is selectively deposited on a pixel opening 6 (FIG. 15). In order to fix the electroluminescent material ink onto the pixel opening and the insulating layer, the pixel opening and the insulating layer are previously treated to render them hydrophilic. The insulating layer is provided from the viewpoint of preventing insulating failure between counter electrodes caused by field concentration at the edge of the electrode, that is, the so-called "interelectrode leak."

A problem involved in the ink jet method is that ink droplets sometimes impact sites different from the openings as the target sites. What is important for placing the electroluminescent material accurately in openings for a large number of respective pixels is to move ink droplets, which have impacted sites different from the pixels, to the pixel openings. To this end, in the Inoue's method, as shown in FIG. 5, the partition wall is subjected to water repellency-imparting treatment. More specifically, the electrode is formed from ITO, the insulating layer is formed from $SiO_2$, and the partition wall is formed from polyimide. After the whole surface of the substrate is once treated $O_2$ plasma to render the whole surface of the substrate hydrophilic, the whole surface of the substrate is treated with $CF_4$ plasma. The treatment with $CF_4$ plasma renders only the polyimide partition wall water-repellent, whereby a desired substrate surface state is realized. Even after the treatment with $CF_4$ plasma, the surface of the ITO electrode and the surface of $SiO_2$ insulating layer maintain the hydrophilicity.

When the partition wall is formed of an insulator, as shown in FIG. 4, the partition wall can serve also as the insulating layer. In this case, the number of steps can be advantageously reduced. In the Inoue's method, however, this is not possible. In order that ink droplets, which have impacted sites different from the pixels, are moved to and accurately fixed to the pixel opening, as shown in FIG. 4, the adoption of a method, wherein the partition wall is rendered water-repellent while the electrode is rendered hydrophilic, is considered effective. In this case, however, a part of the electrode is exposed in a boundary between the partition wall and the electrode, and, as a result, an interelectrode leak disadvantageously occurs between the electrode and the counter electrode.

On the other hand, a method is known wherein the partition wall is not rendered water-repellent to avoid the cissing of the E1 layer in the boundary between the partition wall and the electrode, thereby realizing an organic EL display not involving the problem of the interelectrode leak. In the Inoue's method, the height of the partition wall is about 2 μm, while, in this method, the height of the partition wall is preferably not less than 5 μm from the viewpoint of allowing ink droplets for the EL layer to surely impact the pixel opening. In the drawing, the height of the partition wall is indicated by a character H. Why the height of the partition wall in this method should be larger than the height of the partition wall in the Inoue's method is that, in the Inoue's method, the flow of the ink for the EL layer into sites different from the target pixel opening is prevented by taking advantage of the water repellency of the partition wall, whereas, in the above method, the flow of the ink for the EL layer into sites different from the target pixel opening is prevented by taking advantage of the large height of the partition wall. The utilization of the partition wall having large height, however, poses various different problems.

In order to eliminate the cissing of the ink for the EL layer at the boundary between the partition wall and the electrode, as shown in FIG. 6, a certain level of hydrophilicity should be imparted to the side face of the partition wall to hold the ink for the EL layer on the side face of the partition wall. As described above in connection with the Inoue's method, a polyimide or the like, which is easy to be patterned, is used for the formation of the partition wall. Acrylic resins, photosensitive resists and the like may also be used. These materials are in many cases generally hydrophilic so far as they are originally water-repellent or are not subjected to special water repellency-imparting treatment as post treatment. When the partition wall is formed of these materials, the partition wall can easily hold the ink for the EL layer on the side face thereof and thus can eliminate cissing of the ink for the EL layer at the boundary between the partition wall and the electrode. In this case, however, the formation of the so-called "meniscus" surface state is unavoidable due to surface tension of the liquid caused by the holding of the ink for the EL layer on the side face of the partition wall. When the coating is dried by evaporation of the solvent from the ink for the EL layer while maintaining the meniscus surface shape, the meniscus surface shape in the form of ink as such is reflected. As a result, as shown in FIG. 6, the thickness of the EL layer disadvantageously becomes uneven. Upon the application of an electric field to the EL layer having uneven thickness, current is concentrated in a smaller thickness portion while satisfactory current does not flow in a larger thickness portion. As a result, a different in luminescence brightness occurs between the smaller thickness portion and the larger thickness portion. Actually, as shown in FIG. 7, the application of an electric field to the EL layer having uneven thickness as shown in FIG. 6 causes such an unfavorable phenomenon that luminescence takes place in only the center portion of the pixel having a smaller thickness. FIG. 7 shows the case where the pixel opening is rectangular and the case where the pixel opening is elliptical. Luminescence only in the center portion of the pixel as shown in FIG. 7 cannot provide satisfactory brightness and efficiency as a display.

A problem of breaking of the counter electrode is also important. The counter electrode is generally formed by vapor deposition of a thin metal film. Therefore, the thickness of the metal film which can be stably formed is 100 to 500 nm. A film having a thickness of more than 500 nm is not a thin film, and, in this case, there is an increasing tendency that the film is turned up by the action of the tension of the metal per se and is peeled off. In the above defined film thickness range, when the height of the partition wall is not less than 5 µm, as shown in FIG. 6, breaking is likely to occur in the corner part of the partition wall. This leads to the occurrence of a large number of defective pixels in which an electric field is not applied to the EL layer.

A conventional technique for solving this problem is to adopt a tapered shape in the partition wall as shown in FIG. 8. Also in this case, however, the problem of breaking of the electrode cannot be fully solved. Japanese Patent Laid-Open No. 164181/2002 (Yamazaki et al.) describes that, when the EL layer is formed by vapor deposition, the thickness of the EL layer is small in a boundary part 202 between the partition wall and the electrode and current is concentrated in this part. In this case, as shown in FIG. 9, contrary to the phenomenon shown in FIG. 7, luminescence takes place only around pixels. Also in this case, the brightness and the efficiency of the display are not satisfactory. In order to solve the problems involved in the use of the conventional partition wall structure, that is, the breaking of the electrode and the reduction in thickness of the EL layer at the boundary between the partition wall and the electrode, Yamazaki has adopted a curved shape as shown in FIGS. 10 and 11 in the upper ends and the lower ends of the partition wall. Specifically, as shown in FIGS. 10 and 11, the upper ends 300, 400 of the tapered partition wall are convex relative to the substrate, and the lower ends 301, 401 of the tapered partition wall are concave relative to the substrate. This can realize an organic EL display which has solved the problems of electrode breaking and uneven film thickness.

Figure 21:
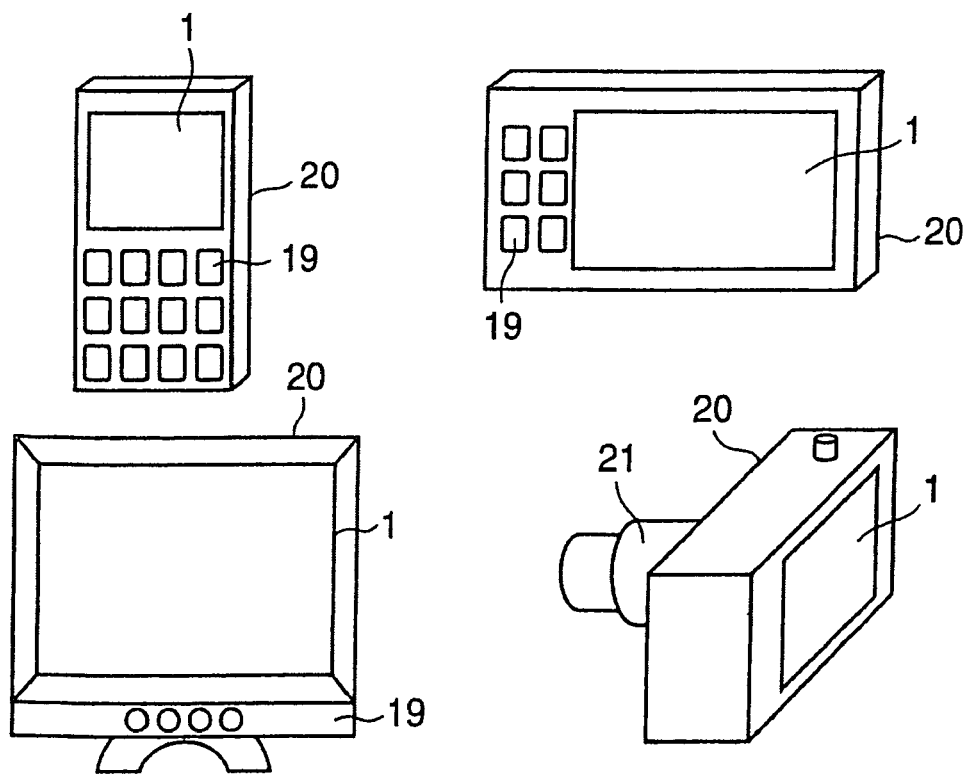
FIG. 21 is an embodiment of an electronic equipment provided with the display according to the present invention.

Equipment on which the display provided by the present invention is mounted as a display part 1 includes those 20 as shown in FIG. 21, for example, a portable telephone (a cellular phone) and PDA (personal digital assistant) type terminals provided with an operating part 19, PCs (personal computers), television sets, video cameras, and digital cameras.

(2) Second Aspect of the Invention

Figure 24:
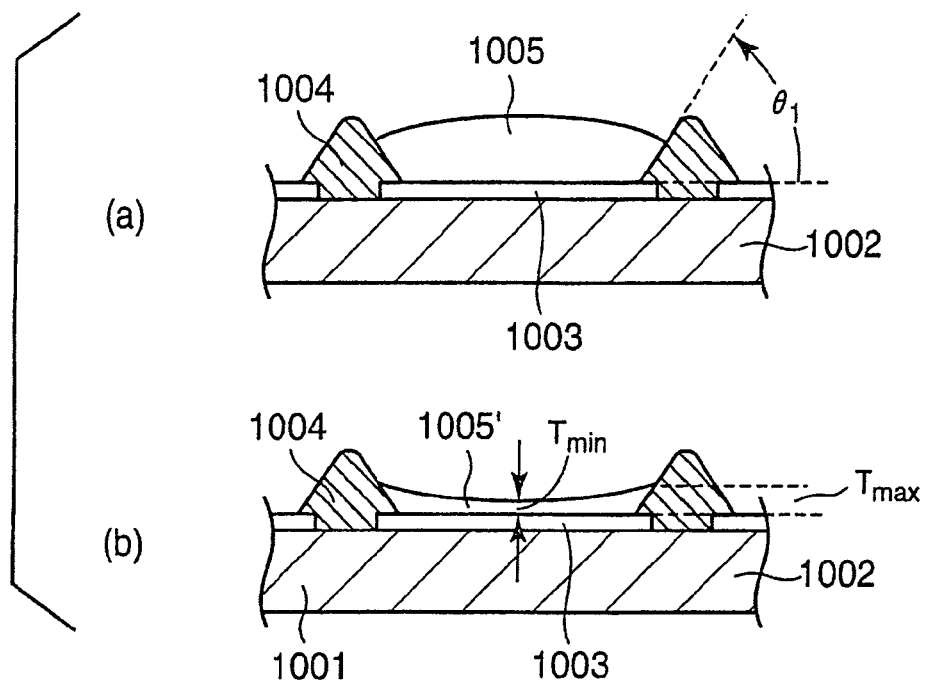
FIG. 24 is a diagram showing a pattern formed object in which partition walls having a single layer structure are provided.
Figure 25:
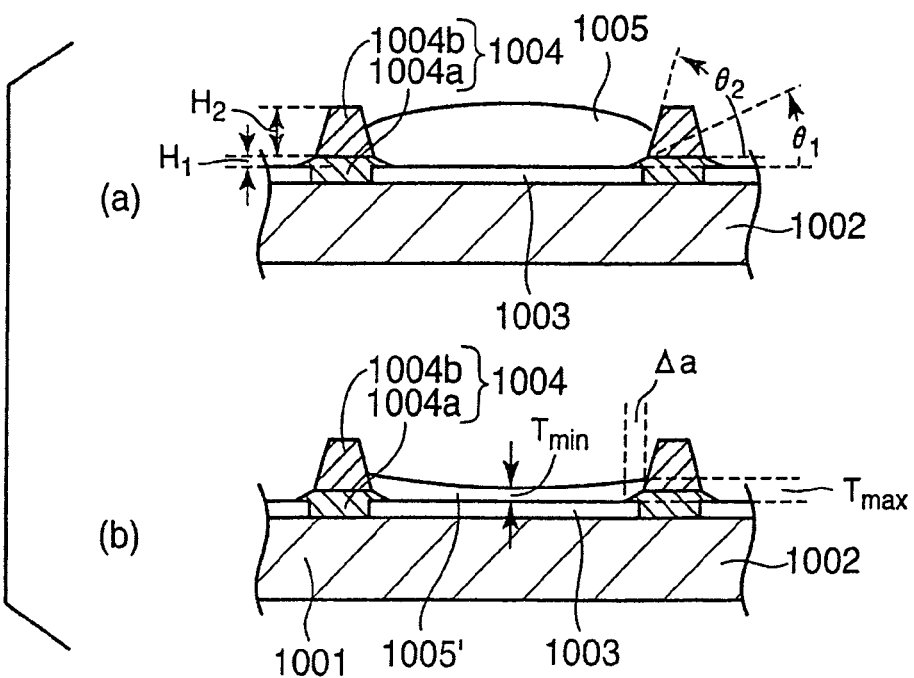
FIG. 25 is a diagram showing a pattern formed object in which partition walls having a two layer structure are provided.

Both FIGS. 24 and 25 are cross-sectional views showing typical structures of the pattern formed object according to the present invention.

As illustrated in FIG. 24, a pattern formed object 1001 according to the present invention includes pixel-shaped electrodes 1003 provided on the substrate 1002 while providing a space therebetween. For example, a partition wall 1004, which is trapezoidal in section, is provided between the electrodes 1003. In this case, the long side of the trapezoid is located on the substrate 1002 side. The partition wall 1004 covers a part of the end of each of the left and right electrodes 1003. A coating 1005', formed by coating a coating liquid 1005 and drying and solidifying the coating, is stacked between the partition walls 1004.

Preferably, both sides of the partition wall 1004 constitute an up-grade slope as viewed from the substrate 1002 side. The inclinations of both sides may be the same or different. When a large number of partition walls 1004 are provided on the substrate 1002, however, the same properties are required of both sides of the partition wall. Therefore, the sectional form of the partition wall 1004 is preferably bilaterally symmetrical relative to a direction perpendicular to the substrate 1002 in the drawing. The sectional form of the partition wall is not limited to a trapezoid, and may be, for example, an isosceles triangle. In the accompanying drawing, the electrode 1003 (1013 in the case of the prior art) is drawn thick for clear understanding. In fact, however, the electrode 1003 is very thin and is negligible relative to the dimension of the height or the like of the partition wall. Therefore, the underside of the partition wall 1004 (surface on the substrate 1002 side) is flat independently of the sectional form shown in the drawing.

The slope of both sides of the partition wall 1004 is not preferably steep and does not have a large gradient close to the right angle to the substrate. As shown in FIG. 24A, the angle $\theta_1$ relative to the substrate 1002 (or relative to the electrode 1003 provided parallel to the substrate 1002) is preferably not more than 60 degrees. When both sides of the partition wall 1004 have this inclination, it is possible to suppress such an unfavorable tendency that, upon drying and solidification of the coating liquid 1005 to form a coating 1005', the coating 1005' in its part around the partition wall 1004 rises along the partition wall and the height of that part defined as the distance between the surface of the coating 1005' and the substrate 1002 is larger than the other parts. The $\theta_2$ may be very small and may be not more than 60 degrees. When the $\theta_2$ is excessively small, the width of the partition wall 1004 (dimension of the partition wall in a direction parallel to the substrate 1002) is excessively large. For this reason, the $\theta_2$ is preferably not less than 30 degrees.

Even when both sides of the partition wall 1004 are in the above inclined state, it is impossible to completely prevent the unfavorable phenomenon in which the height of the coating 1005', defined as the distance between the surface of the coating and the substrate 1002, in its part around the partition wall 1004 is larger than the other parts. Even though the unfavorable phenomenon cannot be completely prevented, as shown in FIG. 26A, in the case of an EL element in which the coating 1005' is provided as a luminescent layer and an electric field is applied to a portion between the lower electrode 1003 and the upper electrode 1003' provided on the coating 1005' to cause luminescence, the coating 1005' in its portion provided on both sides of the partition wall 1004 is off the top of the electrode 1003 and thus is not luminescent. The difference in thickness of the coating 1005' between the thicker part in the left and right sides of the coating except for the part located on the partition wall 1004 and the thinner part located in the center part of the coating 1005' is not significant and thus has no significant influence.

In the prior art technique described in Japanese Patent Laid-Open No. 148429/2002, the partition wall should have a slope necessarily including a concave face in its base part. According to studies conducted by the present inventor, so far as both sides of the partition wall are in a gently inclined state, uneven thickness of the coating 1005' in its part around the partition wall can be eliminated. Even when a part of the slope of both sides of the partition wall is located on the electrode, uniform luminescence can be easily realized in the coating 1005', because the coating 1005' in its part located on the partition wall is not luminescent even when the thickness of that part is somewhat different from that of the other parts. That is, preferably, the slope of the partition wall begins at least at an end of the electrode, more preferably at a position on the electrode.

In the above embodiment, the partition wall 1004 has a single layer structure. Alternatively, the partition wall 1004 may have a two layer structure of a lower layer and an upper layer. Specifically, a two layer structure of a partition wall lower structure 1004a and a partition wall upper structure 1004b as shown in FIG. 25 may be adopted. In the partition wall lower structure 1004a, the sectional form is trapezoidal, and the long side of the trapezoid (as described above, the thickness of the electrode 1003 being negligible) is on the substrate 1002 side. The left and right sides of the partition wall cover the ends of the electrode 1003. The partition wall upper structure 1004b is stacked on the partition wall lower structure 1004a. As shown in FIG. 25, the partition wall upper structure 1004b may be in such a trapezoidal sectional form that the long side of the trapezoid looks toward the partition wall lower structure 1004a side, and the length of the long side is substantially equal to the length of the short side in the cross section of the partition wall lower structure 1004b. Alternatively, the sectional form of the partition wall upper structure 1004b may be in the form of an isosceles triangle or in the form of a circular form. Further, both sides of the partition wall upper structure 1004b may be parallel to each other.

When the partition wall 1004 has the above two layer structure, the slope of the inclined plane in the partition wall lower structure 1004a may be smaller than the slope $\theta_1$. The reason for this is as follows. When the partition wall 1004 has a single layer structure and at the same time, $\theta_1$ is small, the coating 1005 is not applied to an area other than the predetermined area. In this case, an attempt to increase the height of the partition wall 1004 requires increasing the width (dimension in the left and right direction in the drawing) of the partition wall 1004. Therefore, as a whole, this constitutes an obstacle to the formation of a fine pattern.

On the other hand, in the two layer structure, even when the gradient $\theta_1$ of the slope on both sides in the partition wall lower structure 1004a is relatively small and is not more than 30 degrees, the height of the whole partition wall 1004 can be increased by increasing the height of the partition wall upper structure 1004b. Further, since the gradient $\theta_1$ of the slope on both sides in the partition wall lower structure 1004a can be reduced, an increase in thickness of the coating 1005' in its surface located on the partition wall lower structure 1004a relative to the substrate 1002 can be suppressed. The height of the coating 1005' in its part around the partition wall upper structure 1004b relative to the substrate is of course large. This part, however, is outside the top of the lower electrode. Therefore, as shown in FIG. 26B, in the case of an EL element in which the coating 1005' is provided as a luminescent layer and an electric field is applied to a portion between the lower electrode 1003 and the upper electrode 1003' provided on the coating 1005' to cause luminescence, the coating in its part having larger height is not luminescent and thus does not have any adverse effect. The partition wall lower structure 1004a and the partition wall upper structure 1004b preferably satisfy a requirement $H_2 > 2 \times H_1 > 0.1$ μm wherein $H_1$ represents the height of the partition wall lower structure 1004a and $H_2$ represents the height of the partition wall upper structure 1004b. In this case, both the function of the partition wall lower structure 1004a and the function of the partition wall upper structure 1004b can be satisfactorily exhibited. The height of the partition wall lower structure 1004a is preferably not less than 0.05 μm. When the height of the partition wall lower structure 1004a is below the lower limit of the above defined height range, upon the application of an electric field to a portion between the upper and lower electrodes 1003 and 1003' in an EL element produced using this structure, there is a fear that the insulating property cannot be maintained. A larger height of the partition wall lower structure 1004a is more advantageous in the application of the coating liquid 1005. When the resultant pattern formed object 1001 is utilized as an EL element, an excessively large height of the partition wall lower structure 1004a influences the thickness of the EL element. Therefore, the height $H_1$ of the partition wall lower structure 1004a and the height $H_2$ of the partition wall upper structure 1004b preferably satisfy a relationship represented by formula $H_2 > 2 \times H_1$.

The angle $\theta_1$, which is the gradient of the slope of both sides of the partition wall lower structure 1004a in the partition wall 1004, can be reduced to a very small value. In an extreme case, the $\theta_1$ may be 0 (zero) degree. In this case, the partition wall upper structure 1004b may be such that a thin plate is provided perpendicularly to the substrate 1002 and the angle to the substrate is not more than 90 degrees. Ultimately, the partition wall 1004 may be of such a sectional form that "T" formed by joining two straight lines to each other has been inverted. In fact, however, the partition wall lower structure 1004a has a larger height in its center part than the other part from the viewpoints of the preparation of the partition wall and the maintenance of insulation from the electrode. Therefore, the $\theta_1$ value is preferably not less than 5 degrees, more preferably not less than 10 degrees, from a practical viewpoint. In any event, since the gradient of the slope in the partition wall lower structure 1004a may be relatively small, in general, the partition wall lower structure can be easily formed using a commonly used resist composition.

In Japanese Patent Laid-Open No. 148429/2002 described above in connection with the prior art technique, there is a description to the effect that the partition wall may be either a single layer structure or a multilayer structure. This publication, however, is silent on the above-described multilayer structure in a specific form.

The size of the partition wall lower structure 1004a in its slope part on which the partition wall upper structure 1004b is not stacked, that is, the size of the slope part as measured in a direction parallel to the substrate 1002 (Δa in FIG. 25B), is preferably not less than 1 μm. When the size is not less than 1 μm, the coating 1005' in its part having larger height relative to the substrate 1002 than the other part can be constructed to have no influence on luminescence. For the same reason, also in the partition wall 1004 having the above single layer structure, the size of the slope of the partition wall 1004 in a direction parallel to the substrate 1002 is preferably not less than 1 μm. The size of the partition wall 1004 (or the partition wall lower structure 1004a) in its part provided on the electrode 1003 is also preferably not less than 1 μm.

In the pattern formed object 1001 according to the present invention, the adoption of the partition wall 1004 having the above structure can suppress uneven thickness of the coating 1005'. The ratio of the maximum thickness Tmax to the minimum thickness Tmin in the coating 1005', that is, Tmax/Tmin, is preferably not more than 130%. As shown in FIGS. 24B and 25B, the minimum thickness Tmin of the coating 1005' is measured in a portion around the center of the coating 1005' provided between adjacent partition walls 1004. On the other hand, as shown in FIGS. 24B and 25B, the maximum thickness Tmax of the coating 1005' is measured at both ends of the coating in which the electrode 1003 is not covered with the partition wall 1004 and is exposed. Tmax/Tmin is preferably not less than 100%.

The pattern formed object 1001 according to the present invention has been described, while quoting FIGS. 26A and 26B, to be usable as an EL element. When the use of the pattern formed object 1001 according to the present invention as the EL element is contemplated, other layers such as a hole injection layer may be provided. The hole injection layer may be interposed between the electrode 1003 on the substrate 1002 and the coating 1005' as the luminescent layer.

The pattern formed object 1001 according to the present invention can be produced by forming the above partition wall 1004 on the substrate 1002, applying a coating liquid to a portion between the partition walls and drying and solidifying the coating. When the partition wall 1004 to be formed has a two layer structure, the partition wall 1004 is formed in a two-stage process. When the pattern formed object 1001 is used as an EL element, prior to the formation of the partition wall 1004, an electrode is sometimes formed on the substrate 1002. Further, in some cases, in the application of the coating liquid 1005, a method is adopted wherein a composition for hole injection layer formation is applied to form a hole injection layer and a composition for luminescent layer formation is then applied to form a luminescent layer. Further, when the pattern formed object 1001 is used as the EL element, the formation of the luminescent layer is followed by the formation of an electrode different from the above formed electrode. The production process of the pattern formed object 1001 according to the present invention as an EL element and materials used for the production process will be described with reference to FIGS. 28 and 29. The present invention is suitable for the application to an EL element. Further, the present invention is suitably applicable to products, other than EL elements, where partition walls in a lattice form or the like are provided and a part between the partition walls is colored, for example, color filters in which the partition wall is in a black matrix form.

The substrate 1002 of the pattern formed object 1001 is in a plate or film form. Materials usable for constituting the plate or the film include inorganic materials such as glass and quartz or resin plates and films. The term "substrate" as used herein is used as including a plate- or film-shaped material and may be used interchangeably with the term "backing" or "base." When the substrate 1002 is a resin film, a flexible product, which can be rolled or bent, can be provided.

As shown in FIG. 28A, a first electrode 1031 is provided on the substrate 1002. The first electrode 1031 is formed of, for example, a transparent conductive layer and is in many cases formed of a thin film of indium tin oxide (ITO), indium oxide, gold, polyaniline or the like. After the thin film is evenly formed on the whole surface of the substrate, the formation of a resist pattern followed by etching can provide the first electrode 1031 having a desired shape.

The electrode stacked on the substrate 1002 is called a first electrode, and the electrode stacked on the EL layer is called a second electrode. The first and second electrodes may be formed on the whole surface of the substrate, or alternatively may be formed in a pattern form on the substrate. Preferably, any one of the first and second electrodes is an anode, and the other a cathode. Further, preferably, any one of the first and second electrodes is transparent or semi-transparent. Preferably, the anode is formed of a conductive material having a large work function which enables holes to be easily injected, and the cathode is formed of a conductive material having a small work function which enables electrons to be easily injected. Preferably, both the first and second electrodes are formed of a material having the lowest possible electric resistance. A metallic material is generally used. Alternatively, an organic material or an inorganic compound may be used.

Specific examples of anode materials usable for constituting the first and second electrodes include indium tin oxide (ITO), indium oxide, gold, and polyaniline. Specific examples of cathode materials include magnesium alloys, for example, MgAg, aluminum alloys, for example, AlLi, AlCa, and AlMg, and metallic calcium. For both the anode material and the cathode material, a mixture of a plurality of materials may be used.

Figure 28:
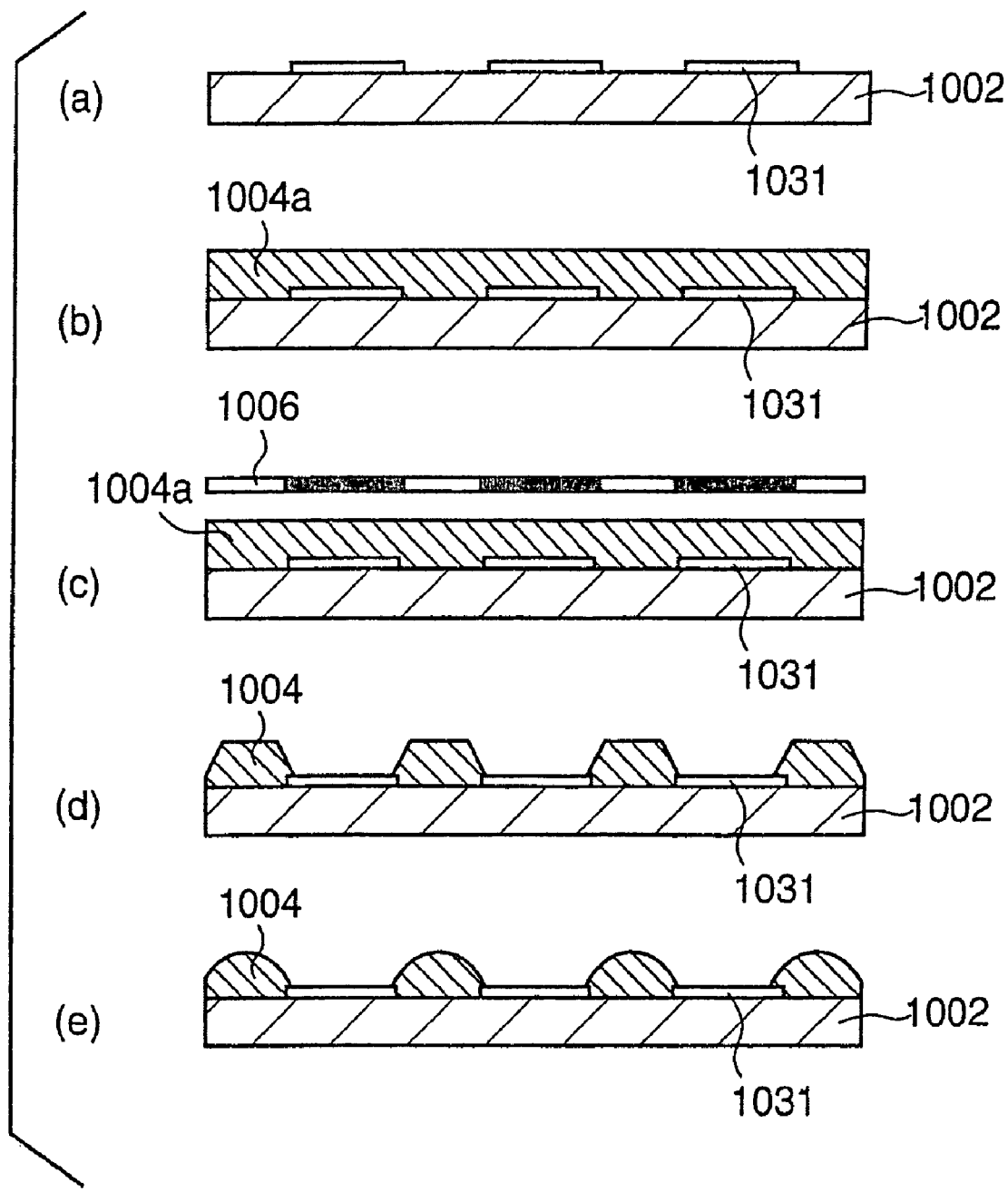
FIG. 28 is a diagram showing a process up to the step at which partition walls are formed in the production process of the present invention.
Figure 29:
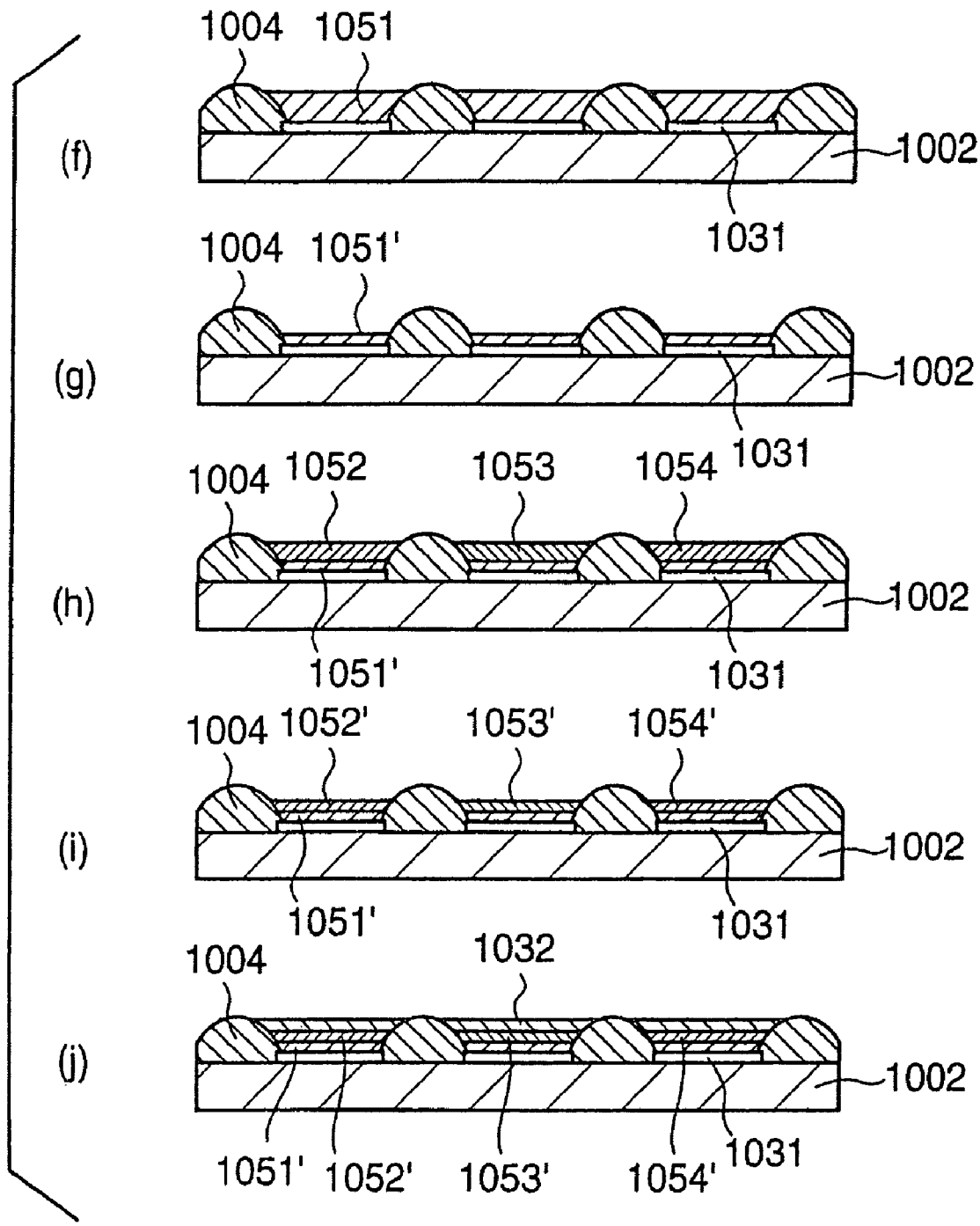
FIG. 29 is a diagram showing a process up to the step at which an electroluminescent element is formed.

A partition wall 1004 is formed on the substrate 1002, with the first electrode 1031 formed thereon, at its parts between first electrode patterns. The partition wall 1004 may be formed by thick layer printing. Alternatively, the partition wall 1004 may be formed as follows. As illustrated in FIG. 28, a coating liquid containing a photosensitive resin is coated onto the whole surface of a substrate 1002 with a first electrode 1031 provided thereon (FIG. 28B) to form a coating 1004a. The coating 1004a is then subjected to patternwise exposure, for example, by placing a mask pattern for exposure and patternwise exposing the coating 1004a to light (FIG. 28C). After the patternwise exposure, the coating 1004a is developed with a predetermined developing solution to form partition walls 1004 in their parts between first electrode patterns (FIG. 28D). If necessary, heat curing may be carried out (FIG. 28E).

Accordingly, the partition wall 1004 may be formed of a cured product of a photosensitive resin. Alternatively, the partition wall may be formed of a cured product of a resin curable upon exposure to an ionizing radiation including an electron beam, a cured product of a thermosetting resin, or a thermoplastic resin. Independently of the type of resin constituting the partition wall 1004, preferably, the partition wall 1004 is formed of a material not containing any liquid repellent component, that is, is formed of a liquid-nonrepellent material or is not liquid-repellent at least in its surface. When the surface of the partition wall 1004 is liquid-nonrepellent, it is possible to solve a problem that, in the formation of a luminescent layer or a hole injection layer, the luminescent layer or hole injection layer in its part near the partition wall is subjected to cissing and, consequently, the center portion of the luminescent layer or hole injection layer rises. When a partition wall 1004 having a two layer structure is formed, the above procedure may be repeated twice, or alternatively a combination of different methods may be used.

Methods for making the angle of the partition wall 1004 to the substrate 1002 (or to the electrode), i.e., $\theta_1$, small include a method wherein a material having relatively low photoresolution is used, a method wherein the height of the partition wall is increased, a method wherein the thickness of the partition wall is increased, a method wherein, at the time of exposure, the gap (spacing) between the mask pattern 1006 and the coating 1004a is increased, a method wherein the exposure is increased, a method wherein the development time is increased, and a method wherein higher temperature conditions are adopted for heat curing after the development.

For example, when the photosensitive positive-working resist is patternwise exposed, a difference in quantity of light occurs between a portion near the surface of the resist and a deeper portion in the resist and, in addition, an unexposed portion around the exposed portion is also dissolved. Therefore, when the thickness is larger, a wider area near the surface is dissolved while, in a deeper portion, a smaller area is dissolved, whereby a partition wall 1004 having small $\theta_1$ is provided. In the patternwise exposure, when the gap between the surface of the resist and the mask pattern is increased, the influence of generated diffracted light extends to a non-opening portion of the mask pattern. Therefore, when the gap is larger, the $\theta_1$ value of the partition wall 1004 is smaller. Under conventional exposure conditions in which the gap is not large, the influence of the diffracted light is not substantially significant. Increasing the exposure causes the influence, and, in this case, the same effect as attained by increasing the gap can be attained. When the development time is increased, as the position is closer to the surface of the resist, the period of time for which the development solution acts is longer. The unexposed portion is also dissolved for this long period of time. Therefore, as with the case where the thickness of the resist is large, a partition wall 1004 having small $\theta_1$ is provided. Alternatively, upon heating of the resist after the development, the sectional form is broken and becomes gently sloped, because the positive-working resist has low heat resistance.

The angle $\theta_1$ can be regulated in the range of 5 to 90 degrees by varying the above conditions for rendering $\theta_1$ small and, if necessary, combining two or more conditions.

Next, in the substrate 1002 with the first electrode 1031 and the partition walls 1004 formed thereon, a coating liquid 1051 for hole injection layer formation is applied to a portion between partition walls 1004 (FIG. 29F). The coating liquid for hole injection layer formation may be applied by a dispenser method wherein the coating liquid is dropped by means of a suitable dispenser for each portion between the adjacent partition walls, or by an ink jet method. Alternatively, the coating liquid may be applied by the so-called "spin coating" wherein the coating liquid is dropped on a suitable position on the substrate 1002 and the substrate 1002 is then rotated at a high speed to spread the coating liquid. The applied coating liquid 1051 for hole injection layer formation is heated by heat treatment such as vacuum heat treatment to form a hole injection layer 1051'.

Materials usable for constituting the hole injection layer (or the anode buffer material) include phenylamine compounds, star burst-type amine compounds, phthalocyanine compounds, oxides such as vanadium oxide, molybdenum oxide, ruthenium oxide, and aluminum oxide, amorphous carbon, polyaniline, and polythiophene derivatives.

For example, an aqueous solution of poly(3,4)ethylenedioxythiophene/polystyrene sulfonate (abbreviated to PEDOT/PSS, manufactured by Bayer; tradename: Baytron P AI 4083; commercially available as an aqueous solution) commercially available as a composition for hole injection buffer formation may also be used as the coating liquid for hole injection layer formation. The hole injection layer may also be formed of an alternate adsorption multilayer film.

In the production process of the pattern formed object according to the present invention, in dropping a coating liquid in a portion between the partition walls 1004 by means of a dispenser or in applying the coating liquid by an ink jet method, when the partition wall 1004 has a slope, since the opening on which the coating liquid is applied is wide, the tolerance of the control of the position of dropping by means of a dispenser or the control of the position of the application of the coating liquid by the ink jet method can be advantageously increased.

In the production process of the pattern formed object according to the present invention, the partition wall 1004 at least in its surface is preferably liquid-nonrepellent. When the partition wall 1004 at least in its surface is liquid-nonrepellent, particularly in applying the coating liquid 1051 for hole injection layer formation, the coating liquid 1051 is less likely to cause cissing from the partition wall 1004. Therefore, advantageously, even a method which can evenly coat the coating liquid onto a relatively wide area, such as a spin coating method, can be utilized. When the partition wall 1004 is liquid-repellent, it is difficult to adopt a process for forming a hole injection layer on the whole surface of the substrate, such as a spin coating method. In this case, just at the time when the coating liquid 1051 for hole injection layer formation is placed on the whole surface of the substrate, the coating liquid causes cissing from the partition wall 1004 and cannot be evenly coated without difficulties. Even if the coating liquid can be coated by any method, the hole injection layer (in many cases, having hydrophilic nature) is very likely to stay on the partition wall 1004. In this case, there is a fear of the liquid repellency being lost.

The height of the partition wall 1004 is preferably larger than the level of the applied coating liquid for hole injection layer formation, because the partition wall 1004 is liquid-nonrepellent. In the prior art technique, the partition wall used in this field is liquid-repellent. In this case, when the level of the applied coating liquid is larger than the height of the partition wall, the coating liquid undergoes cissing from the partition wall. As a result, there is no possibility that the coating liquid applied to the portion between the partition walls passes over the partition wall and overflows into the adjacent area. On the other hand, in the present invention, since the partition wall 1004 is liquid-nonrepellent, when the coating liquid is applied only once, there is a possibility that the amount of the applied coating liquid is smaller than that in the prior art technique in which liquid repellent partition walls are utilized. In this case, if necessary, the application of the coating liquid may be repeated twice or more. The above relationship between the height of the partition wall and the level of the coating liquid and the application of the coating liquid twice or more are not limited to the application of the coating liquid for hole injection layer formation and are also applied to the application of the coating liquid for luminescent layer formation and coating liquids for other layer formation.

A luminescent layer is formed in a portion between adjacent partition walls provided on the substrate 1002 with the hole injection layer 1051' formed thereon. Preferably, the following method is adopted. For example, a coating liquid 1052 for a luminescent layer for red luminescence, a coating liquid 1053 for a luminescent layer for green luminescence, and a coating liquid 1054 for a luminescent layer for blue luminescence are provided and applied respectively to a portion between a pair of adjacent partition walls, a portion between another pair of adjacent partition walls, and a portion between a further pair of adjacent partition walls so that luminescence of different color can be provided for each luminescent layer (FIG. 29H). Thereafter, the coatings are heat dried or vacuum dried (optionally with heating) to solidify the coatings. Thus, a luminescent layer 1052' for red luminescence, a luminescent layer 1053' for green luminescence, and a luminescent layer 1054' for blue luminescence are formed (FIG. 29I). In this case, individual spaces defined by partition walls 1004 are coated with respective coating liquids separately from one another. Therefore, preferably, the coating liquid is dropped by a dispenser or is applied by an ink jet method. In some cases, an identical coating liquid is applied to all spaces defined by the partition walls to form luminescent layers which exhibit luminescence of an identical color. In this case, preferably, the coating liquid is applied by a method, for example, spin coating, which can evenly coat the coating liquid in a relatively wide area.

An EL element layer for luminescence provided between the first and second electrodes may consist of a luminescent layer alone, or alternatively may comprise a hole injection layer and a luminescent layer. Here these two types of EL element layers will be mainly described. The EL element layer, however, is not limited to these types only. For example, EL element layers having various layer constructions, for example, an EL element layer comprising a luminescent layer and an electron injection layer and an EL element layer comprising a luminescent layer, a hole injection layer, and an electron injection layer provided in that order, may be adopted.

Materials usable for constituting the luminescent layer may be classified roughly into coloring matter-type materials, metal complex-type materials, and polymer-type materials.

Coloring matter-type materials include cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene cyclic compounds, pyridine cyclic compounds, perynone derivatives, perylene derivatives, oligothiophene derivatives, trifumanylamine derivatives, oxadiazole dimers, and pyrazoline dimers.

Metal complex-type materials include metal complexes having aluminum (Al), zinc (Zn), beryllium (Be), etc. or rare earth metals such as terbium (Tb), europium (Eu) and dysprosium (Dy) as central metals, and oxadiazole, thiadiazole, phenylpyridine, phenyl benzimidazole and quinoline structures, etc. as ligands, and examples of metal complexes include quinolinol aluminum complexes, benzoquinolinol beryllium complexes, benzoxazole zinc complexes, benzothiazole zinc complexes, azomethyl zinc complexes, porphyrin zinc complexes, and europium complexes.

Polymer-type materials include polyparaphenylene vinylene derivatives, polythiophene derivatives, polyparaphenylene derivatives, polysilane derivatives, polyacetylene derivatives, polyvinyl carbazole, and polyfluorene derivatives.

Doping materials may be incorporated in the material for constituting the luminescent layer. Doping materials include perylene derivatives, coumarin derivatives, rubrene derivatives, quinacridone derivatives, squarium derivatives, porphyrin derivatives, styryl-based colorants, tetracene derivatives, pyrazoline derivatives, decacyclene, and phenoxazone.

The material for constituting the luminescent layer may be dissolved or dispersed in a suitable solvent to prepare a coating liquid for luminescent layer formation. In the present invention, preferably, the coating liquid for luminescent layer formation, the coating liquid for hole injection layer formation and other applicable coating liquids have a surface tension of not more than 40 dyn/cm, more preferably not more than 35 dyn/cm. When the surface tension exceeds 40 dyn/cm, the thickness of the coating is likely to become uneven.

A second electrode is formed on the luminescent layer provided on the substrate 1002. In principle, materials usable for constituting the second electrode may be the same as those described above in connection with the first electrode. Examples of preferred materials for the second electrode include magnesium alloys such as MgAg, aluminum alloys such as AlLi, AlCa, and AlMg, and metallic calcium.

When the formation of a cathode buffer layer is contemplated, materials usable for cathode buffer layer formation include aluminum-lithium alloys, lithium fluoride, strontium, magnesium oxide, magnesium fluoride, strontium fluoride, calcium fluoride, barium fluoride, aluminum oxide, strontium oxide, calcium, polymethyl methacrylate, and sodium polystyrenesulfonate.

When the formation of an electron injection layer is contemplated, any material may be used without particular limitation so far as the material is an electron transport material. Low-molecular electron transport materials include oxadiazole derivatives, diphenylquinone derivatives, and anthraquinodimethane derivatives. High-molecular electron transport materials include a dispersion of the above low-molecular materials in polymeric binders. Polymeric binders include polysilane and thiophene oligomers. The electron injection layer may be formed using these materials by vapor deposition or the like in the case of the low-molecular material or by a conventional wet process in the case of the high-molecular material.

EXAMPLES

The following examples further illustrate but do not limit the present invention.
(1) First Aspect of the Invention
(Example A1)
A coating liquid for organic EL layer formation according to the present invention was prepared according to the following formulation.

| (Preparation of coating liquid for organic EL layer formation) | |
|---|---|
| Polyvinylcarbazole | 70 pts. wt. |
| Oxadiazole compound | 30 pts. wt. |
| Coumarin 6 (*fluorescent dye) | 1 pt. wt. |
| 1,1,2-Trichloroethane (solvent) | 633 pts. wt |

*When the fluorescent dye is coumarin 6, green fluorescence having a peak at 501 nm is obtained; when the fluorescent dye is perylene, blue fluorescence having a peak at 460 to 470 nm is obtained; and when the fluorescent dye is DCM, red fluorescence having a peak at 570 nm is obtained. They were used as luminescent materials for respective colors.

(Preparation of EL Display)

Figure 22:
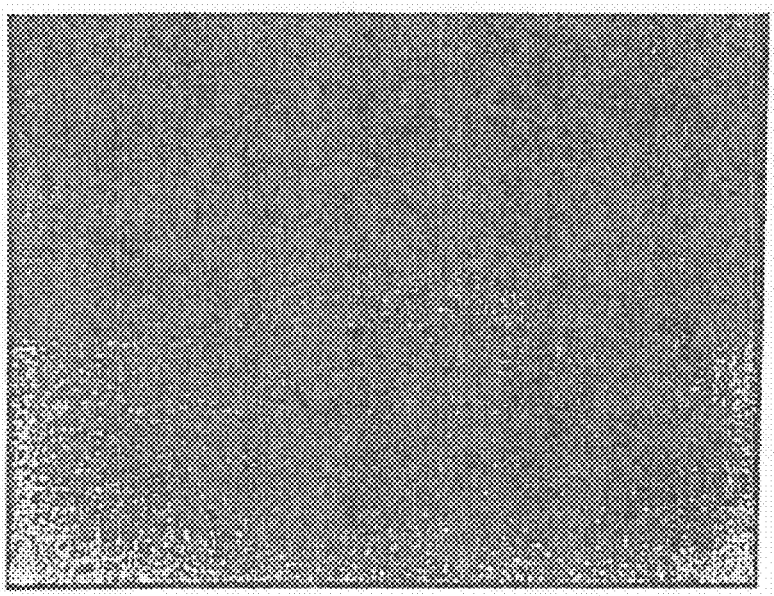
FIG. 22 is a scanning electron photomicrograph of the cross section of a display in an embodiment of the present invention.

A substrate, with an electrode and a partition wall formed thereon, having a sectional form shown in FIG. 1 was provided. The partition wall covered the end of the electrode so that the partition wall functions also as an electrode insulating layer. The electrode was formed by forming a transparent electrode formed of ITO, a nesa film, IZO or the like and patterning the transparent electrode by etching. The partition wall was formed by spin coating a photosensitive resist OFPR-800 (viscosity 500 cp) manufactured by Tokyo Ohka Kogyo Co., Ltd. at 1200 rpm, prebaking the coating at 110° C., then exposing the coating to light using a photomask, developing the coating, and post-baking the developed coating at 240° C. The height of the partition wall (layer thickness) formed under the above conditions was 6 μm. The shape of the partition wall thus formed can be easily observed, for example, under a scanning electron microscope (SEM). Observation under SEM revealed that the partition wall was convexly curved in section relative to the surface of the substrate and that the sectional form comprised a part of an arc. FIG. 22 shows a scanning electron photomicrograph of the cross section of the partition wall.

A transparent electrode is used for a bottom emission-type element structure. In this case, a transparent substrate is used. A top emission-type element structure may be formed by using a metal in the electrode. The electrode opening was in a rectangular form having a size of 100 μm×300 μm.

After cleaning the substrate, a buffer layer was formed by spin coating PEDOT/PSS (polythiophene: Bayer CH 8000) having a hole injection property to a thickness of 80 nm and baking the coating at 160° C. The above coating liquid for organic EL layer formation was ejected onto the pixel opening on PEDOT by an ink jet method, and the coating was dried at 80° C. to form a 100 nm-thick luminescent layer. Subsequently, an Mg(magnesium)-Ag(silver) alloy (Mg:Ag=10:1) was vapor deposited to a thickness of 150 nm. Silver (Ag) was then vapor deposited thereon as a protective layer to a thickness of 200 nm to form a cathode electrode.

When an active matrix display is prepared using a TFT substrate, the cathode electrode is formed on the whole area. On the other hand, when a passive matrix display is prepared, the cathode electrode is formed in a stripe form orthogonally to the electrode pattern on the substrate.

Separately, the above procedure was repeated up to the step at which the luminescent layer was formed on the substrate. The substrate was observed under SEM and an atomic force microscopy (AFM). As a result, it was confirmed that, as shown in FIG. 2, in the major part of the pixel opening, the EL layer provided in the pixel opening was flat although the thickness of the EL layer in its part around the boundary 110 between the EL layer and the partition wall was slightly larger than the other part of the EL layer. The EL layer in its part around the boundary 110 between the EL layer and the partition wall shown in FIG. 2 was found to be curved in section in a direction opposite to the curved sectional form of the partition wall (protrusion) and to be in smooth contact with the partition wall.

A DC electric field was applied across the electrode for observation of luminescence in the pixel opening. As a result, unlike luminescence shown in FIGS. 7 and 9, any luminescence failure derived from uneven thickness of the EL layer did not take place. When a control circuit was connected and an image signal was input, a color display with excellent display performance could be provided.

(Example A2)

The procedure of Example A1 was repeated, except that conditions for the treatment of the resist material were changed.

Figure 23:
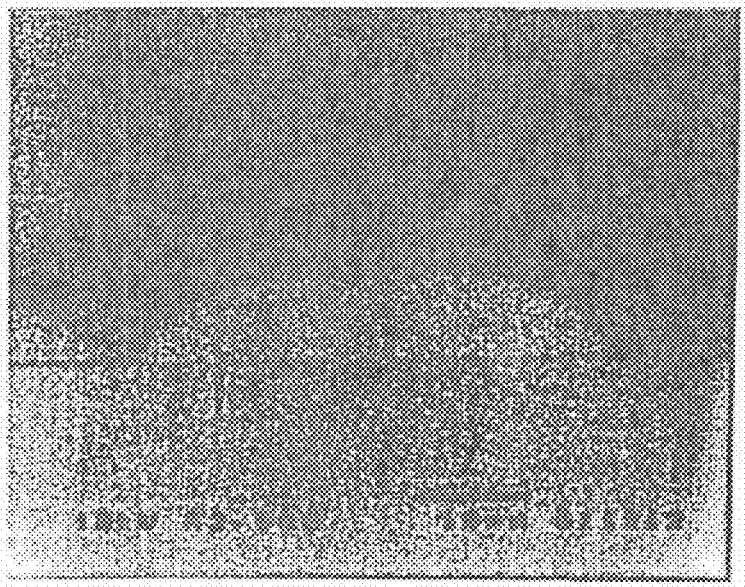
FIG. 23 is a scanning electron photomicrograph of the cross section of a display in another embodiment of the present invention.

Specifically, the same resist material as used in Example A1 was treated in the same manner as in Example A1, except that the post-baking temperature was changed to 180° C. The shape of the partition wall was observed under SEM. As a result, as shown in FIG. 3, it was confirmed that the partition wall was convexly curved in section relative to the surface of the substrate and that the sectional form of the protrusion comprised a part of an arc and a flat part located in the upper part of the protrusion and extended continuously from the arc part. FIG. 23 shows a scanning electron photomicrograph of the cross section of the partition wall.

Next, an EL display was prepared in the same manner as in Example A1.

Separately, the above procedure was repeated up to the step at which the luminescent layer was formed on the substrate. The substrate was observed under SEM and an atomic force microscopy (AFM). As a result, it was confirmed that, as shown in FIG. 3, in the major part of the pixel opening, the EL layer provided in the pixel opening was flat although the thickness of the EL layer in its part around the boundary 101 between the EL layer and the partition wall was slightly larger than the other part of the EL layer. The EL layer in its part around the boundary 101 between the EL layer and the partition wall shown in FIG. 3 was found to be curved in section in a direction opposite to the curved sectional form of the protrusion and to be in smooth contact with the partition wall.

A DC electric field was applied across the electrode for observation of luminescence in the pixel opening. As a result, unlike luminescence shown in FIGS. 7 and 9, any luminescence failure derived from uneven thickness of the EL layer did not take place. When a control circuit was connected and an image signal was input, a color display with excellent display performance could be provided.

(Example A3)

The procedure of Examples A1 and A2 was repeated, except that, as shown in FIG. 20, the pixel opening had a shape free from any corner part instead of the rectangular shape.

In Examples A1 and A2, in the pixel, uniform luminescence could be almost achieved. When the number of pixels was increased, however, some pixels were defective and the yield of the products was not very high. On the other hand, when the shape of the pixel opening was free from any corner part, the yield was improved and this pixel opening shape was more effective in a practical display of which the number of pixels was larger than that of VGA.

The present invention has been described with reference to working examples. However, it should be noted that the present invention is not limited to these examples only.

(2) Second Aspect of the Invention

In the preparation of pattern formed objects of examples and comparative example, steps up to the step at which a partition wall was formed on a substrate were carried out as follows.

(Example B1)

Figure 30:
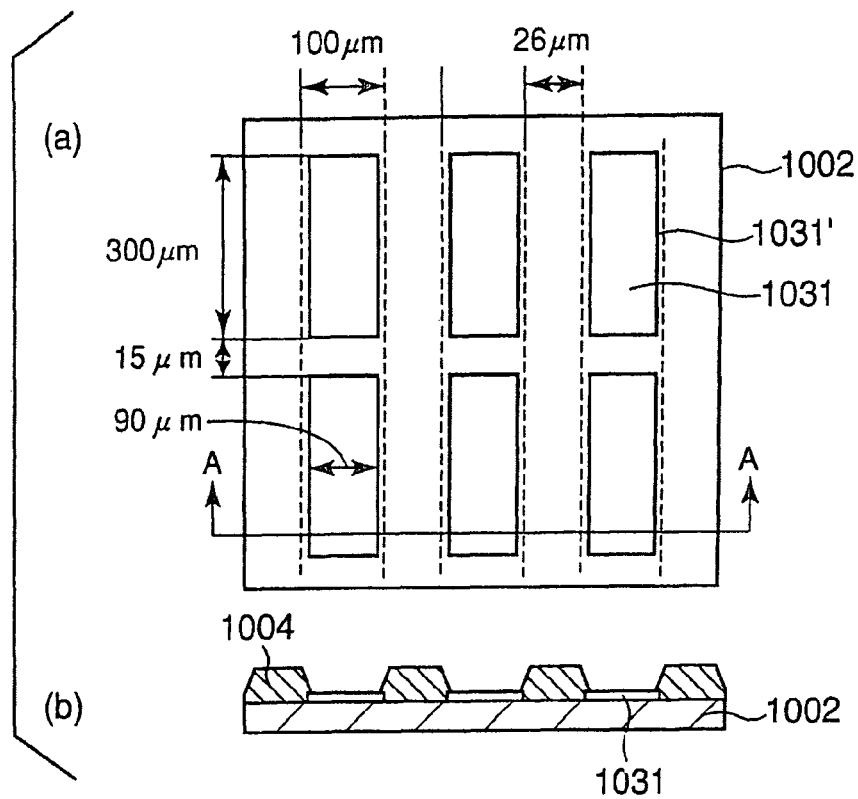

A glass substrate with stripe-shaped transparent ITO electrodes (first electrodes) 1031 formed thereon at width: 100 μm and pitch in widthwise direction: 126 μm (space width: 26 μm) was provided. At the outset, a positive-working photosensitive material (tradename: OFPR-800/800 CP, manufactured by Tokyo Ohka Kogyo Co., Ltd.) was spin coated on the whole surface of the substrate with ITO electrodes formed thereon to form a 15 μm-thick photosensitive resin layer. The photosensitive resin layer was exposed and developed. After the completion of the development, the resin layer was heat treated at 250° C. for 30 min. As shown in FIG. 30A, after registration in such a manner that 5 μm from both ends in widthwise direction of each stripe-shaped transparent ITO electrode is covered with the resin layer, openings 1031' having width: 90 μm, pitch in widthwise direction: 126 μm, length: 300 μm, and spacing in lengthwise direction: 15 μm were formed. As shown in FIG. 30B which is a diagram taken on line A-A of FIG. 30A, the sectional form of partition walls formed of a cured product of the photosensitive resin layer remaining unremoved in the formation of the openings was such that the wall was convexly protruded relative to the glass substrate and had wall thickness (size of the wall in its part in contact with the glass substrate in widthwise direction in the drawing): 36 μm, height: 12 μm, and angle of both sides of the wall to the glass substrate: 55 degrees. Conditions for providing the angle 55 degrees were previously determined by a trial and error method. As compared with conventional etching and the like, the positive-working photosensitive material was applied to a larger thickness, the gap between the mask pattern and the coating at the time of exposure was made larger, the exposure was larger, and the development time was longer.

(Example B2)

Figure 31:
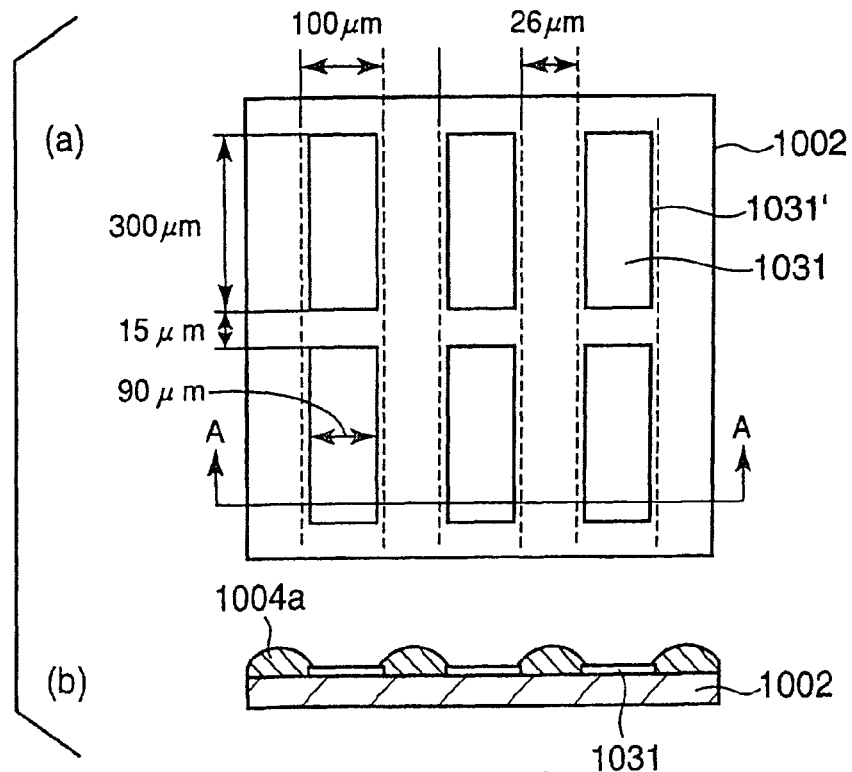

In the same manner as in Example B1, a glass substrate with transparent ITO electrodes 1031 formed thereon was provided, and a positive-working photosensitive material (tradename: TLER P-002PM, manufactured by Tokyo Ohka Kogyo Co., Ltd.) was spin coated on the whole surface of the substrate with ITO electrodes formed thereon to form a 2.5 μm-thick photosensitive resin layer. The photosensitive resin layer was exposed and developed. After the completion of the development, the resin layer was heat treated at 250° C. for 30 min. As shown in FIG. 31A, after registration in such a manner that 5 μm from both ends in widthwise direction of each stripe-shaped transparent ITO electrode is covered with the resin layer, openings 1031' having width: 90 μm, pitch in widthwise direction: 126 μm, length: 300 μm, and spacing in lengthwise direction: 15 μm were formed. As shown in FIG. 30B which is a diagram taken on line A-A of FIG. 30A, the sectional form of partition walls formed of a cured product of the photosensitive resin layer remaining unremoved in the formation of the openings was such that the wall 1004*a* was convexly protruded relative to the glass substrate and had wall thickness (size of the wall in its part in contact with the glass substrate in widthwise direction in the drawing): 36 μm, height: 2.2 μm, and angle of both sides of the wall to the glass substrate: 15 degrees. The partition walls 1004*a* thus formed were designated as first partition walls.

Figure 32:
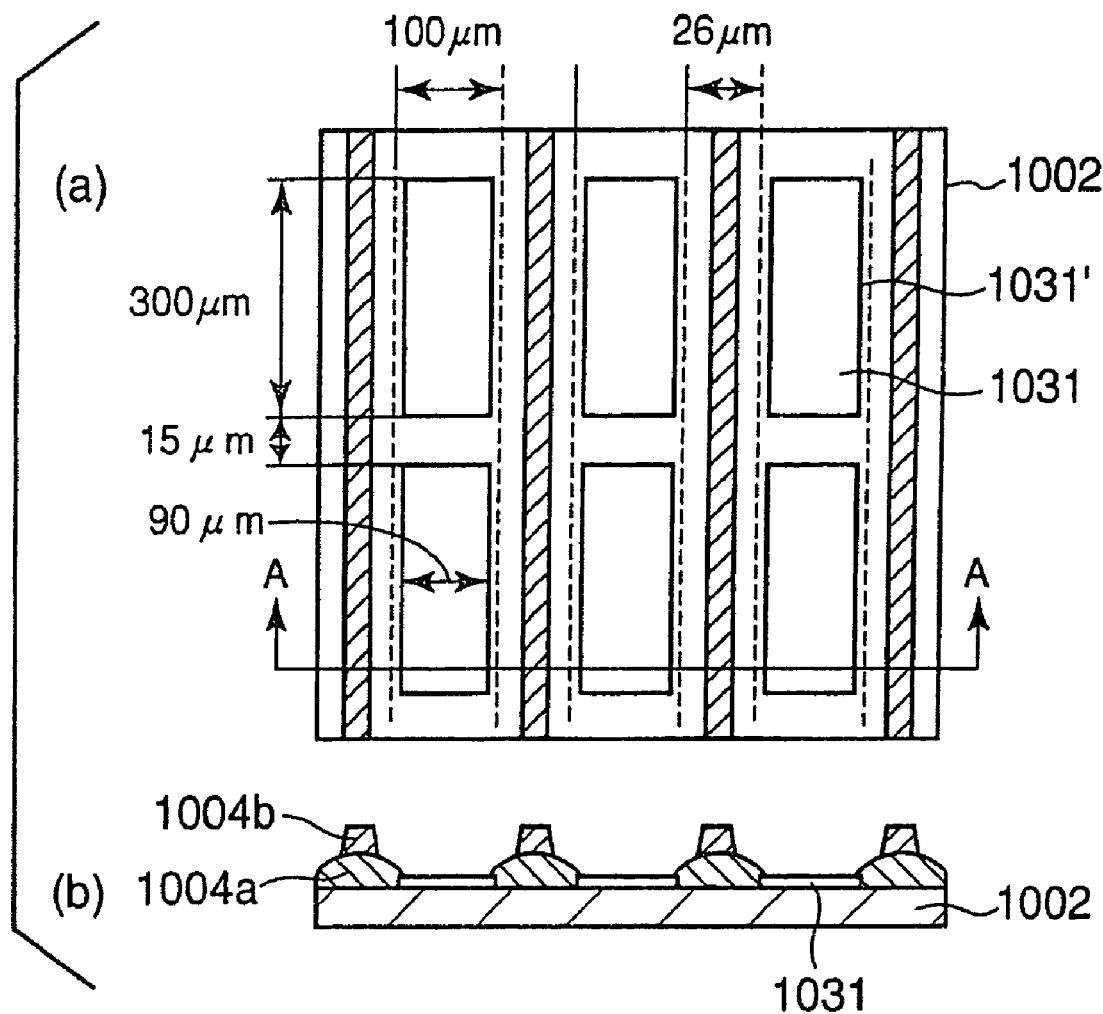

The same positive-working photosensitive material as used in Example B1 was spin coated on the glass substrate with the first partition walls 1004*a* formed thereon to form a 12 μm-thick photosensitive resin layer. The photosensitive resin layer was exposed and developed. After the completion of the development, the resin layer was heat treated at 250° C. for 30 min. As shown in FIG. 32, second partition walls 1004*b* having wall thickness (size of the wall in its part in contact with the glass substrate in widthwise direction in the drawing): 20 μm, total height of the first and second partition walls: 12 μm, and angle of both sides of the walls excluding the first partition walls 1004*a* to the glass substrate: 60 degrees were formed on the first partition walls 1004*a*.

(Comparative Example)

In the same manner as in Example B1, a glass substrate with transparent ITO electrodes 1031 formed thereon was provided, and a positive-working photosensitive material (tradename: PMER P-LA900, manufactured by Tokyo Ohka Kogyo Co., Ltd.) was spin coated on the whole surface of the substrate with ITO electrodes formed thereon to form a 15 μm-thick photosensitive resin layer. The photosensitive resin layer was exposed and developed. After the completion of the development, the resin layer was heat treated at 250° C. for 30 min. As shown in FIG. 30A, after registration in such a manner that 5 μm from both ends in widthwise direction of each stripe-shaped transparent ITO electrode is covered with the resin layer, openings 1031' having width: 90 μm, pitch in widthwise direction: 126 μm, length: 300 μm, and spacing in lengthwise direction: 15 μm were formed. As shown in FIG. 30B which is a diagram taken on line A-A of FIG. 30A, the sectional form of partition walls formed of a cured product of the photosensitive resin layer remaining unremoved in the formation of the openings was such that the wall was convexly protruded relative to the glass substrate and had wall thickness (size of the wall in its part in contact with the glass substrate in widthwise direction in the drawing): 36 μm, height: 12 μm, and angle of both sides of the wall to the glass substrate: 70 degrees.

The glass substrates with partition walls formed thereon prepared above were provided. A commercially available composition for hole injection buffer formation (poly(3,4) ethylenedioxythiophene/polystyrene sulfonate (abbreviated to PEDOT/PSS, tradename: Baytron P AI 4083, manufactured by Bayer, available as an aqueous solution) was spin coated onto the whole surface of the substrate on its partition wall side to a thickness of 1,000 angstroms.

Thereafter, a 1.0% (by mass) tetralin solution of polyfluorene was provided as a composition for organic luminescent material layer formation. The solution was ejected to each portion between adjacent partition walls by means of an ink jet apparatus in which ink is ejected by applying voltage to a piezoelectric element. The coatings were then dried in a vacuum heat drier under conditions of temperature: 100° C. and degree of vacuum: 150 mTorr to form a luminescent layer for red luminescence. A thin film of calcium (Ca) having a thickness of 1,000 angstroms as a second electrode and a thin film of aluminum (Al) having a thickness of 2,000 angstroms as a protective electrode were formed in that order by vacuum deposition on the luminescent layer for red luminescence. Thus, EL elements (=EL light emitting elements) of Example B1, Example B2, and Comparative Example were prepared.

The first electrode (ITO) side of the EL light emitting element was connected to the positive electrode side, and the second electrode (Ca) side was connected to the negative electrode side. A direct current was allowed to flow with a source meter, and the luminescent area of the pixel part was observed under an optical microscope. Further, the maximum thickness and the minimum thickness of the luminescent layer for red luminescence within the pixel (corresponding to the exposed portion of the first electrode (ITO)) were measured by observation of the cross section under SEM. The results are shown in Table 1 below. In Table 1, the luminescent area ratio is the ratio of actually light emitted area to the designed area of the luminescent part.

TABLE 1

| | Tmax/Tmin, % | Luminescent area ratio |
|---|---|---|
| Example B1 | 180 | 0.50 |
| Example B2 | 130 | 0.80 |
| Comparative Example | 115 | 0.90 |

The invention claimed is:

1. A pattern formed object comprising:
   a substrate on which electrodes are provided with a space between the electrodes;
   partition walls provided on the substrate on which the electrodes are provided and in the space between the electrodes; and
   a coating formed on an upper surface of the electrodes provided on the substrate in its part between the partition walls, wherein
   the coating comprises an EL light emitting layer formed by a dispenser method or an ink jet method,
   said partition walls have a liquid-nonrepellent surface and have such a sectional form that, at least in a lower part of the partition wall, as the distance from the substrate increases, the size of the partition wall in a direction parallel to the substrate decreases,
   the size of the partition walls in its part provided on the electrode in a direction parallel to the substrate is not less than 1 μm, and
   in said coating, the ratio of the maximum thickness (Tmax) to the minimum thickness (Tmin), Tmax/Tmin, is not more than 130% as measured in the coating in its part between the lower ends of the partition walls adjacent to each other.

2. The pattern formed object according to claim 1, wherein the angle of the lower part of the partition wall to the substrate is not more than 60 degrees.

3. The pattern formed object according to claim 2, wherein each of the partition walls comprises a lower partition wall structure, which is provided on the substrate side and is in the form of a trapezoid, in section, with the long side being located on the substrate side, and an upper partition wall structure provided on the lower partition wall structure.

4. The pattern formed object according to claim 3, wherein the angle of the slope of the lower partition wall structure to the substrate is not more than 30 degrees.

5. The pattern formed object according to claim 3, wherein the distance between the lower part of the upper partition wall structure and the end of the lower partition wall structure on its substrate side as measured in a direction parallel to the substrate is not less than 1 µm.

6. The pattern formed object according to claim 3, wherein the height $H_1$ of the lower partition wall structure as measured in a direction perpendicular to the substrate and the height $H_2$ of the upper partition wall structure satisfy a requirement represented by $H_2 > 2 \times H_1 > 0.1$ µm.

7. A pattern formed object for an electroluminescent element, comprising the pattern formed object according to any one of claims 1 to 6, said coating being an EL light emitting layer interposed between a first electrode and a second electrode.

8. The pattern formed object for an electroluminescent element according to claim 7, wherein said EL light emitting layer has a hole injection layer stacked on its substrate side.

* * * * *